US012802643B2

(12) United States Patent
Yuan et al.

(10) Patent No.: US 12,802,643 B2
(45) Date of Patent: Nov. 17, 2026

(54) DISPLAY PANEL AND DISPLAY DEVICE

(71) Applicant: HKC CORPORATION LIMITED, Shenzhen (CN)

(72) Inventors: Xin Yuan, Shenzhen (CN); Xiufeng Zhou, Shenzhen (CN); Chen Chen, Shenzhen (CN); Haijiang Yuan, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 19/366,627

(22) Filed: Oct. 23, 2025

(65) Prior Publication Data

US 2026/0120640 A1 Apr. 30, 2026

(30) Foreign Application Priority Data

Oct. 31, 2024 (CN) ......................... 202411552919.1

(51) Int. Cl.
*G09G 3/3233* (2016.01)
*H10K 59/131* (2023.01)

(52) U.S. Cl.
CPC ......... *G09G 3/3233* (2013.01); *H10K 59/131* (2023.02); *G09G 2300/0819* (2013.01); *G09G 2300/0852* (2013.01); *G09G 2300/0861* (2013.01); *G09G 2310/08* (2013.01); *G09G 2320/0223* (2013.01); *G09G 2320/0233* (2013.01); *G09G 2330/021* (2013.01)

(58) Field of Classification Search
CPC ......... G09G 3/3233; G09G 2300/0819; G09G 2300/0852; G09G 2300/0861; G09G 2310/08; G09G 2320/0223; G09G 2320/0233; G09G 2330/021; H10K 59/131
See application file for complete search history.

(56) References Cited

U.S. PATENT DOCUMENTS

| | | | | |
|---|---|---|---|---|
| 10,242,620 | B2 * | 3/2019 | Zhu | G09G 3/3233 |
| 11,842,687 | B1 * | 12/2023 | Fan | G09G 3/3233 |
| 11,869,423 | B2 * | 1/2024 | Gao | G09G 3/3233 |
| 12,211,451 | B2 * | 1/2025 | Zhou | G09G 3/3233 |
| 12,223,903 | B2 * | 2/2025 | Gao | G09G 3/3233 |
| 12,340,749 | B2 * | 6/2025 | Uchida | G09G 3/20 |
| 12,387,657 | B2 * | 8/2025 | Shin | G09G 3/32 |
| 2018/0190194 | A1 * | 7/2018 | Zhu | G09G 3/3233 |
| 2023/0206832 | A1 * | 6/2023 | Gao | G09G 3/3233 345/211 |
| 2024/0005872 | A1 * | 1/2024 | Zhou | G09G 3/3233 |
| 2024/0112635 | A1 * | 4/2024 | Gao | G09G 3/3233 |
| 2024/0395204 | A1 * | 11/2024 | Uchida | G09G 3/20 |
| 2025/0336348 | A1 * | 10/2025 | Shin | G09G 3/32 |

* cited by examiner

*Primary Examiner* — Michael Pervan
(74) *Attorney, Agent, or Firm* — HAUPTMAN HAM, LLP

(57) ABSTRACT

Disclosed are a display panel and a display device. Each pixel unit in the display panel is configured to execute image display according to a received data signal. In a pixel unit, a driving module and a light-emitting module are sequentially connected in series between a first power supply terminal and a second power supply terminal, an adjustment module is electrically connected to the driving module, and an initialization reset module is electrically connected to the driving module and the second power supply terminal.

17 Claims, 9 Drawing Sheets

DISPLAY PANEL AND DISPLAY DEVICE

CROSS-REFERENCE TO RELATED APPLICATIONS

This application claims priority to Chinese Patent Application No. 202411552919.1, filed Oct. 31, 2024, the entire disclosure of which is incorporated herein by reference.

TECHNICAL FIELD

This disclosure relates to the field of display technology, and in particular, to a display panel and a display device.

BACKGROUND

An organic light-emitting diode (OLED) display device has the advantages of self-illumination, low driving current, high luminous efficiency, short response time, high clarity and contrast, a viewing angle close to 180° C., a wide temperature range for application, and flexible display and large-area full-color display, etc., and is considered to be the most promising display device in the industry. However, since the light-emitting material of the OLED is driven by a current to emit light, as panel sizes increase, in order to reduce the heating of the large-size OLED panel, the current for driving the light-emitting material of the OLED needs to be as small as possible, and in this case, the transistor for controlling the driving current is likely to have threshold voltage variation which lead to inconsistent driving current passing through the transistor under the control of the same data voltage, which results in different light emitting intensities of the OLED, and leads to a poor display effect of the display panel. Therefore, how to adjust and compensate the threshold voltage variation to improve the display effect is an urgent problem to be solved.

SUMMARY

In a first aspect, a display panel is provided in embodiments of the present disclosure. The display panel includes a display region, the display panel includes multiple pixel units arranged in an array, and the multiple pixel units each is configured to execute image display according to a received data signal. Each of the multiple pixel units includes a driving module, an adjustment module, an initialization reset module, and a light-emitting module, the driving module and the light-emitting module are sequentially connected in series between a first power supply terminal and a second power supply terminal, the adjustment module is electrically connected to the driving module, and the initialization reset module is electrically connected to the driving module and the second power supply terminal. The initialization reset module is configured to transmit a second power supply voltage provided by the second power supply terminal to the driving module according to an adjustment control signal in an initialization reset period and a compensation period, to cooperate to perform reset and data compensation on the driving module. The adjustment module is configured to adjust a threshold voltage of at least one driving switch transistor of the driving module to be within a preset range according to the adjustment control signal in cooperation with the second power supply voltage in the initialization reset period and the compensation period, the at least one driving switch transistor is configured to provide a driving current to the light-emitting module according to the data signal in a light-emitting period in cooperation with a first power supply voltage provided by the first power supply terminal and to drive the light-emitting module to emit corresponding light to execute image display. The initialization reset period, the compensation period, a data loading period, and the light-emitting period are sequentially arranged in time.

In a second aspect, a display device is provided in embodiments of the disclosure. The display device includes a power supply module and the above-mentioned display panel. The power supply module is configured to supply driving power for the display panel to drive the display panel to execute image display. The display panel includes a display region, the display panel includes multiple pixel units arranged in an array, and the multiple pixel units each is configured to execute image display according to a received data signal. Each of the multiple pixel units includes a driving module, an adjustment module, an initialization reset module, and a light-emitting module, the driving module and the light-emitting module are sequentially connected in series between a first power supply terminal and a second power supply terminal, the adjustment module is electrically connected to the driving module, and the initialization reset module is electrically connected to the driving module and the second power supply terminal. The initialization reset module is configured to transmit a second power supply voltage provided by the second power supply terminal to the driving module according to an adjustment control signal in an initialization reset period and a compensation period, to cooperate to perform reset and data compensation on the driving module. The adjustment module is configured to adjust a threshold voltage of at least one driving switch transistor of the driving module to be within a preset range according to the adjustment control signal in cooperation with the second power supply voltage in the initialization reset period and the compensation period, the at least one driving switch transistor is configured to provide a driving current to the light-emitting module according to the data signal in a light-emitting period in cooperation with a first power supply voltage provided by the first power supply terminal and to drive the light-emitting module to emit corresponding light to execute image display. The initialization reset period, the compensation period, a data loading period, and the light-emitting period are sequentially arranged in time.

BRIEF DESCRIPTION OF THE DRAWINGS

To describe technical solutions of embodiments of the present disclosure more clearly, the following will give a brief introduction to accompanying drawings used for describing embodiments. Apparently, the accompanying drawings hereinafter described are some embodiments of the disclosure. Based on these drawings, those of ordinary skill in the art can also obtain other drawings without creative effort.

Figure 1:
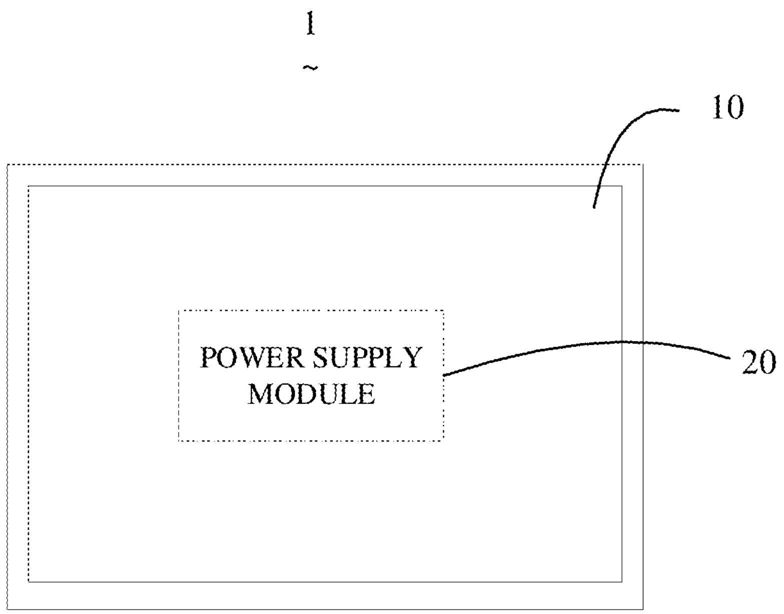
FIG. 1 is a schematic structural diagram of a display device provided in an embodiment of the present disclosure.

DESCRIPTION OF REFERENCE SIGNS display device—1, display panel—10, power supply module—20, display region—10*a*, non-display region—10*b*, n data lines—D1~Dn, m scan lines—S1~Sm, m adjustment control lines—Com 1~Com m, m light-emitting control lines—EM1~EMm, first direction—F1, second direction—F2, timing control circuit—11, data driving circuit—12, scan driving circuit—13, light-emitting driving circuit—14, scan clock signal—CK, light-emitting clock signal—ECK, pixel unit—15, driving module—151, control module—152, adjustment module—153, storage module—154, light-emitting module—155, data loading module—156, initialization reset module—157, first node—N1, second node—N2, third node—N3, fourth node—N4, driving switch transistor—T1, second switch transistor—T2, third switch transistor—T3, fourth switch transistor—T4, first data loading control terminal—T40, first data loading conductive terminal—T41, second data loading conductive terminal—T42, fifth switch transistor—T5, second data loading control terminal—T50, third data loading conductive terminal—T53, fourth data loading conductive terminal—T54, sixth switch transistor—T6, first initialization control terminal—T60, first initialization conductive terminal—T61, second initialization conductive terminal—T62, seventh switch transistor—T7, first capacitor—C1, second capacitor—C2, light-emitting element—E, scan line—Si, data line—Di, light-emitting line—EM, EM i, adjustment control line—Com, Com i, first power supply terminal—VDD, second power supply terminal—ELVSS, ground terminal—GND, initialization reset period—H1, compensation period—H2, data loading period—H3, light-emitting period—H4, data signal—Data, substrate—100, driving layer—200, first active layer—ACT1, first gate insulation layer—GI1, first gate—GT1, first buffer layer—BU1, second gate insulation layer—GI2, interlayer insulation layer—ILD, first source-drain layer—SD1, first planarization layer—PLN1, second source-drain layer—SD2, buffer layer—Buffer, second active layer—ACT2, second gate—GT2, second planarization layer—PLN2, display layer—300, anode—AND, organic material layer—OLED, cathode—CAT, shielding structure—400, overhanging conductive structure—401, blocking structure—402, first distance—LL1, and second distance—LL2.

DETAILED DESCRIPTION

In order to facilitate understanding of the present disclosure, a detailed description will now be given with reference to relevant accompanying drawings. The accompanying drawings illustrate some examples of implementations of the present disclosure. However, the present disclosure can be implemented in many different forms and is not limited to the implementations described herein. On the contrary, these embodiments are provided for a more thorough and comprehensive understanding of the present disclosure.

The following description of the embodiments refers to the accompanying drawings to illustrate specific embodiments of the present disclosure. Sequential references assigned to components in the description, such as "first", "second", etc., are used merely to distinguish between described objects and do not have any ordinal or technical meaning. However, the expressions "connected" and "coupled" in the present disclosure, unless otherwise specified, both include direct connection and indirect connection. Directional terms mentioned in the present disclosure, for example, "upper", "lower", "front", "rear", "left", "right", "inner", "outer", "side", or the like are only directions with reference to the accompanying drawings, and therefore, the directional terms are used for better and clearer illustration and understanding of the present disclosure, rather than indicate or imply that the indicated device or element must have a particular orientation or be constructed and operated in a particular orientation. Therefore, it cannot be understood that the present disclosure is limited thereto.

In description of the present disclosure, it should be noted that, unless stated otherwise, terms "installing", "coupling", and "connecting" referred to herein should be understood in broader sense. For example, they may include a fixed coupling, a removable coupling, or an integrated coupling; they may include a mechanical coupling or an electrical coupling; they may include a direct coupling, an indirect coupling through a medium, or an interconnection between two components, or an interaction coupling between two components. For those of ordinary skill in the art, the above terms in the present disclosure can be understood according to specific situations. The terms "first", "second", and the like used in the specification, the claims, and the accompany drawings of the disclosure are used to distinguish different objects rather than describe a particular order.

Additionally, as used herein, the term "including", "may include", "including", or "may include" indicates the existence of corresponding functions, operations, elements, etc. that are disclosed, and does not limit one or more other functions, operations, elements, etc. In addition, the terms "include" or "include" means that there are corresponding features, numbers, steps, operations, elements, components, or a combination thereof disclosed in the description, and do not exclude the presence or addition of one or more other features, numbers, steps, operations, elements, components, or a combination thereof, and are intended to cover a non-exclusive inclusion. In addition, when describing embodiments of the present disclosure, "can" is used to mean "one or more embodiments of the present disclosure". Also, the term "exemplary" is intended to mean examples or illustrations.

Unless otherwise defined, all technical and scientific terms used herein have the same meaning as commonly understood by those skilled in the art of the present disclosure. The terms used herein in the disclosure are for the purpose of describing implementations only and are not intended to limit the disclosure.

In view of the limitations associated with the aforementioned technical issues, the present disclosure provides a display panel and a display device with a better display effect.

In comparison with the related art, in embodiments of the present disclosure, the threshold voltage of the driving switch transistor in the pixel unit is adjusted to be within the preset range before the data signal is written, so that the problem that the light-emitting intensities of adjacent pixel units are different due to the threshold voltage difference is effectively solved. In addition, the second power supply voltage is transmitted to the driving module through the initialization reset module in the initialization reset period and the compensation period for reset, so that the voltage of the driving switch transistor is effectively maintained to be stable, thereby avoiding the influence on the adjustment of the threshold voltage caused by the voltage change. Furthermore, in embodiments of the present disclosure, the pixel units can be compensated in the non-image-display phase, which reduces occupation of the display phase, and effectively avoids insufficient compensation time caused by the reduction of compensation time in order to ensure the refresh rate of image display. In this way, the compensation time is effectively increased, so that the threshold voltage of the driving module is more fully compensated, the accuracy and uniformity of image display are ensured, and thus the image display effect is better.

Further, in embodiments of the present disclosure, since the switch transistors included in the data loading module and the initialization reset module are oxide thin film transistors with relatively small leakage current, which is beneficial to realizing low-frequency driving. Since the leakage current of the oxide thin film transistors is relatively small, it is more beneficial to maintain the voltage of the corresponding driving module at the corresponding node, so that no brightness attenuation occurs in low-frequency driving. The switch transistors included in the driving module, the control module, and the adjustment module are low-temperature poly-silicon thin film transistors with a relatively high mobility, so that the driving current can be effectively increased, thereby ensuring that the display element can generate relatively high luminance, and at the same time, the voltage drop caused by its own resistor of the low-temperature poly-silicon thin film transistor can also be reduced, so that the voltage the low-temperature poly-silicon thin film transistor reaches a preset potential faster.

Further, in embodiment of the present disclosure, in a layer structure of the display panel corresponding to each pixel unit, since the oxide thin film transistor is farther away from the substrate than the low-temperature poly-silicon thin film transistor, the oxide thin film transistor is closer to the shielding structure than the low-temperature poly-silicon thin film transistor, and therefore, it is more convenient for the oxide thin film transistor to be electrically connected to the second power supply terminal through the shielding structure and receive the second power supply voltage from external in the manufacturing process. At the same time, the oxide thin film transistor and the low-temperature poly-silicon thin film transistor are staggered in the thickness direction of the display panel, thereby being more beneficial to reducing the space occupied by the thin film transistors in the plane where the display panel is located, reducing the area occupied by the pixel unit, and providing a larger space for improving the pixel resolution of the display panel.

In embodiments of the present disclosure, the overhanging conductive structure in the shielding structure is connected to a ground terminal and the second power supply terminal of an external power supply module. The overhanging conductive structure is configured to transmit a ground voltage received from external as the second power supply voltage to the second power supply terminal, so as to provide the low second power supply voltage for the pixel unit, thereby eliminating the need to separately adjust a control line, and further simplifying a wiring structure of the pixel unit and the display panel.

In this embodiment, the shielding structure is a mesh structure as a whole, so that the overall resistance of a wiring in the display panel, which is connected to the second power supply terminal and provides the ground voltage, is relatively small, thereby ensuring that each pixel unit can accurately obtain the low second power supply voltage, and facilitating the pixel unit to accurately obtain a compensation signal and a data signal so as to accurately execute image display.

Reference is made to FIG. 1, which is a schematic structural diagram of a display device 1 provided in an embodiment of the present disclosure. The display device 1 includes a display panel 10, a power supply module 20, and other functional modules. The power supply module 20 is disposed on a back face of the display panel 10, i.e. a non-display face of the display panel 10. The power supply module 20 is configured to supply driving power for performing image display on the display panel 10. In this embodiment, the display device 1 may be an electronic display device such as a mobile phone or a tablet computer.

Figure 2:
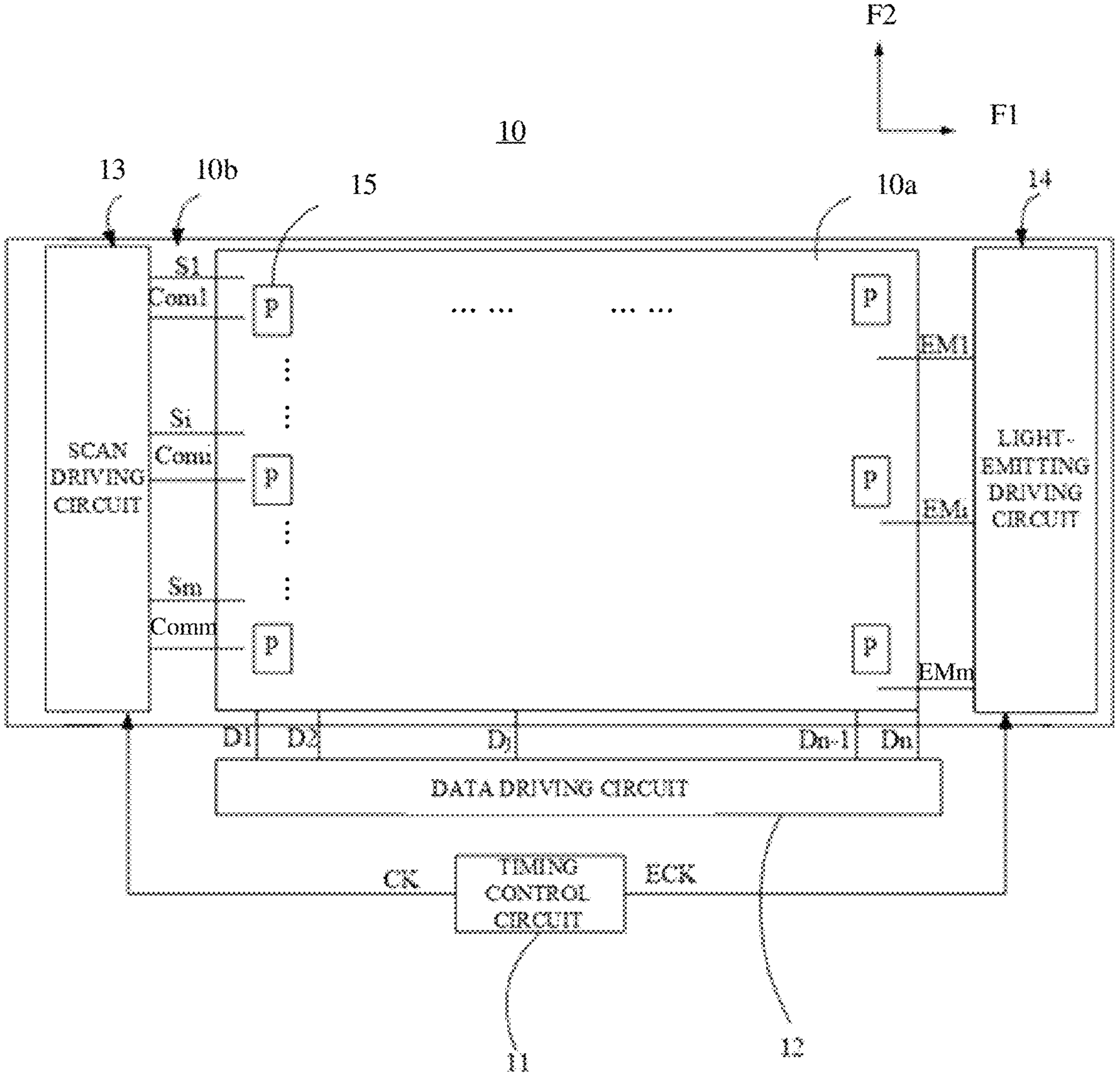
FIG. 2 is a schematic planar layout diagram of the display panel in FIG. 1.

Reference is made to FIG. 2, which is a schematic planar layout diagram of the display panel in FIG. 1.

As illustrated in FIG. 2, the display region of the display panel 10 includes multiple pixel units 15 arranged in a matrix, n data lines D1~Dn, m scan lines S1~Sm, m adjustment control lines Com 1~Com m, and m light-emitting control lines EM1~EMm, m and n being natural numbers greater than 1. The m scan lines S1~Sm each extend along a first direction F1 and are insulated from each other and arranged in parallel along a second direction F2. The n data lines D1~Dn each extend along the second direction F2 and are insulated from each other and arranged in parallel along the first direction F1. The first direction F1 is perpendicular to the second direction F2. The m adjustment control lines Com 1~Com m and the m light-emitting control lines EM1~EMm each also extend along the first direction F2, and are arranged insulated from each other and arranged in parallel along the second direction F1. The m adjustment control lines Com 1~Com m can each receive a corresponding adjustment control signal KS from a scan driving circuit 13. The light-emitting control lines EM1~EMm are connected to a light-emitting driving circuit 14 and each are configured to receive a light-emitting signal from the light-emitting driving circuit 14.

In the non-display region **10*b* of the display panel 10, a timing control circuit 11 for driving pixel units to display images, a data driving circuit 12, and a scan driving circuit 13, and a light-emitting driving circuit 14** are provided.

The timing control circuit 11 is electrically connected to the data driving circuit 12, the scan driving circuit 13, and the light-emitting driving circuit 14, and is configured to control operation timing of the data driving circuit 12, the scan driving circuit 13, and the light-emitting driving circuit 14. In other words, a scan clock signal CK and a light-emitting clock signal ECK are outputted to the scan driving circuit 13 and the light-emitting driving circuit 14 respectively, so as to control when to output a corresponding scan signal and data signal. In the present embodiment, the timing control circuit 11 is configured to receive an image signal representing image information from an external signal source, and output a scan clock signal CK, a light-emitting clock signal ECK, a horizontal synchronizing signal, and a vertical synchronizing signal which work synchronously, so as to correspondingly control the scan driving circuit 13, the light-emitting driving circuit 14, and the data driving circuit 12 to correspondingly output a scan signal, a light-emitting signal, and a data signal.

The data driving circuit 12 is electrically connected to the n data lines D1~Dn and is configured to transmit data signals (Data) for display to the multiple pixel units 15 in the form of a data voltage via the n data lines D1~Dn. The pixel units 15 are disposed in a display region 10*a* of the display panel 10. In the present embodiment, the non-display region 10*b* is disposed in a peripheral region of the display region 10*a*.

The scan driving circuit 13 is electrically connected to the m scan lines S1~Sm, and is configured to transmit scan signals via the m scan lines S1~Sm to control when the pixel units 15 receives data signals. In some embodiments, the scan driving circuit 13 may output scan signals via the m scan lines S1~Sm in turn according to a position arrangement order of the m scan lines S1~Sm and a scanning cycle. Of course, the scan driving circuit 13 may also perform scanning in other orders according to specific requirements, for example, the scan driving circuit 13 output scan signals via S1, S3, S5 in turn, and so on, which is not limited in the present disclosure.

The scan driving circuit 13 is further connected to the pixel units through the m adjustment control lines Com 1~Com m, and is configured to output adjustment control signals KS to various pixel units 15 through the m adjustment control lines Com 1~Com m correspondingly. Of course, in other embodiments of the present disclosure, the m adjustment control lines Com 1~Com m may also be connected to other circuit modules independent of the scan driving circuit 13.

The light-emitting driving circuit 14 is configured to output a corresponding light-emitting signal to the pixel unit 15 in the display region 10*a* according to the light-emitting clock signal ECK. The scan driving circuit 13 and the light-emitting driving circuit 14 may be integrated in the same circuit module, and of course, the scan driving circuit 13 and the light-emitting driving circuit 14 may also be independently disposed in the non-display region 10*b* of the display panel 10.

Figure 3:
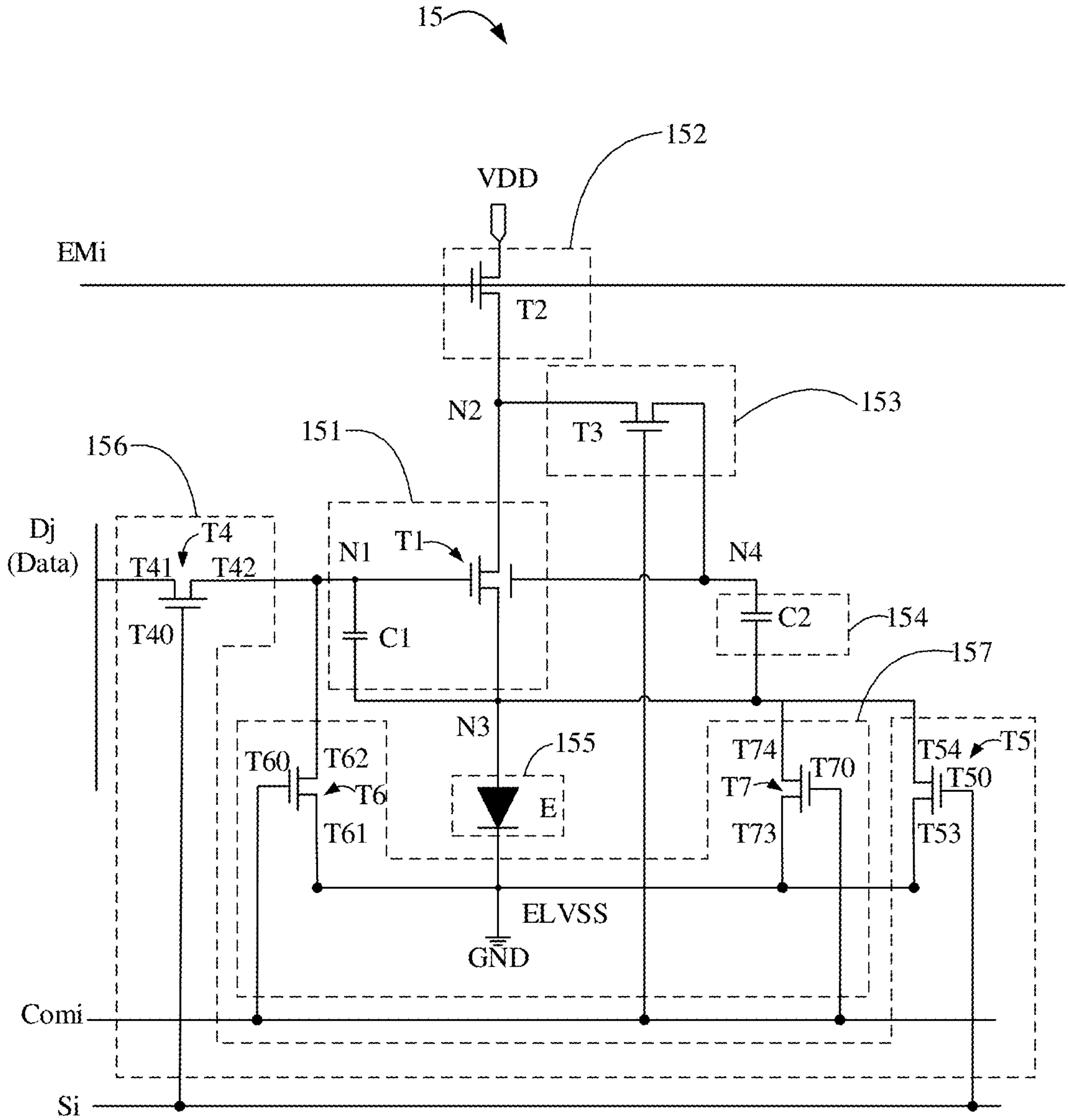
FIG. 3 is a schematic diagram of an equivalent circuit of a pixel unit in FIG. 2.

Reference is made to FIG. 3, which is a schematic diagram of an equivalent circuit of a pixel unit in FIG. 2.

As illustrated in FIG. 3, the pixel unit 15 includes a driving module 151, a control module 152, an adjustment module 153, a storage module 154, a light-emitting module 155, a data loading module 156, and an initialization reset module 157.

The driving module 151 is connected to the data loading module 156 via a first node N1, and the control module 152, the driving module 151, and the light-emitting module 155 are sequentially connected in series between a first power supply terminal VDD and a second power supply terminal ELVSS. The control module 152 is adjacent to the first power supply terminal VDD, and the light-emitting module 155 is adjacent to the second power supply terminal ELVSS. Specifically, the data loading module 156 is further connected to the data line Dj and the scan line Si, and is electrically connected to the driving module 151 through the first node N1 so as to provide a data signal Data to the driving module 151. The driving module 151 is configured to generate a corresponding driving current Ids according to the data signal Data provided by the data loading module 156 via the first node N1 in cooperation with a first power supply voltage provided by the first power supply terminal VDD, and transmit the driving current Ids to the light-emitting module 155 so as to drive the light-emitting module 155 to emit corresponding light to display an image corresponding to the data signal Data.

A second node N2 is disposed between the control module 152 and the driving module 151, and a third node N3 is disposed between the driving module 151 and the light-emitting module 155. The adjustment module 153 is electrically connected to the driving module 151 and the control module 152 through the second node N2, and is also electrically connected to the driving module 151 through a fourth node N4 of the driving module 151. The storage module 154 is connected to the driving module 151 through the fourth node N4 and the third node N3.

In this embodiment, the first power supply terminal VDD is configured to provide the first power supply voltage at a high voltage level, and the second power supply terminal ELVSS is configured to provide a second power supply voltage at a low voltage level. It can be understood that the first power supply voltage is greater than the second power supply voltage. In this embodiment, the second power supply terminal ELVSS is directly connected to a ground terminal GND, and the provided second power supply voltage at a low voltage level may be a ground voltage of 0V.

The control module 152 is configured to control the first power supply terminal VDD to charge the storage module 154 through the adjustment module 153, and the storage module 154 is configured to cooperate with the adjustment module 153 to adjust a threshold voltage Vth of the driving module 151, so as to adjust the threshold voltage of the driving module 151 to be within a preset range.

The initialization reset module 157 is connected to the adjustment control line Com i and electrically connected to the driving module 151 through the first node N1 and the third node N3, to provide an initialization reset voltage for the first node N1 connected to the driving module 151 and the third node N3 connected to the light-emitting module 155 under the adjustment control signal KS provided by the adjustment control line Com i, so that the driving module 151 and the light-emitting module 155 perform an initialization reset. The initialization reset module 157 is further configured to simultaneously cooperate with the adjustment module 153 to provide the second power supply voltage to the driving module 151 so as to perform threshold voltage Vth adjustment. In this embodiment, the initialization reset voltage is the second power supply voltage at a low voltage level provided by the second power supply terminal ELVSS, for example, 0V.

The threshold voltage Vth of the driving module 151 in the pixel unit 15 can be directly adjusted to be within a preset range by the adjustment module 153 and the storage module 154. Therefore, the threshold voltages Vth of the driving modules 151 in adjacent pixel units 15 can be adjusted to be within the same preset range, so as to solve the problem that light intensities of the adjacent pixel units are different due to different threshold voltages Vth of the driving modules 151. In this way, the brightness difference between adjacent pixel units 15 is avoided, and the display effect is effectively improved. In the present embodiment, the adjustment control signal KS is also used in cooperation with the adjustment module 153 to adjust the threshold voltage Vth of the driving module 151.

The first node N1, the second node N2, the third node N3, and the fourth node N4 included in the pixel unit 15 can have the following specific connections. The data loading module 156 is electrically connected to a first control terminal of the driving module 151 through the first node N1. The fourth node N4 is electrically connected to a second control terminal of the driving module 151, the adjustment module 153 and the storage module 154, in other words, the adjustment module 153 is electrically connected to the storage module 154 through the fourth node N4. The adjustment module 153 is further electrically connected to the second node N2 and further electrically connected to the driving module 151 and the control module 152 through the second node N2. The data loading module 156 is electrically connected to the third node N3, and is further electrically connected to the storage module 154, the driving module 151, and the light-emitting module 155 through the third node N3. The data loading module 156 is configured to provide the second power supply voltage to the driving module 151 through the third node N3.

It can be understood that a display phase of any frame of image includes m continuous scanning cycles. The m scanning cycles are continuous in time, and the m continuous scanning cycles respectively correspond to m scan lines S1~Sm (m rows of pixel units P) in a one-to-one correspondence in sequence. In each scanning cycle, the working process and timing stages of reset, data compensation, data writing, and light emitting can be performed on a row of pixel units connected to the same scan line. For example, any one scanning cycle, for example, the i-th scanning cycle includes an initialization reset period H1, a compensation period H2, a data loading period H3, and a light-emitting period H4 which are continuous in time.

In the initialization reset period H1, the initialization reset module 157 provides the initialization reset voltage to the driving module 151 and the light-emitting module 155 according to the adjustment control signal KS provided by the adjustment control line Com i, so that the driving module 151 and the light-emitting module 155 perform an initialization reset. It can be understood that the initialization reset voltage is the second power supply voltage provided by the second power supply terminal ELVSS.

In this embodiment, in the initialization reset period H1, the control module 152 provides the first power supply terminal VDD to the fourth node N4 through the adjustment module 153 under the control of the light-emitting signal provided by the light-emitting line EMi.

In the compensation period H2, the first power supply terminal VDD stops provide any voltage to the fourth node through the control module 152, and the storage module 154 is capable of storing the charge of the fourth node N4 and maintaining the potential of the fourth node N4. Meanwhile, the fourth node N4 discharges to the driving module 151 and the third node N3 sequentially through the adjustment module 153 and the second node N2. The voltage of the fourth node N4 is gradually reduced, and at the same time, the threshold voltage of the driving module 151 is adjusted to a preset value.

In the data loading period H3, the data loading module 156 receives the data signal Data and transmit the data signal Data to the first node N1, while the second power supply voltage is also applied to the third node N3.

In the light-emitting period H4, the control module 152 controls the first power supply terminal VDD to output the first power supply voltage to the driving module 151 through the second node N2, and the driving module 151 controls the first power supply voltage to drive the light-emitting module 155 to emit light in the light-emitting period H4 according to the received data signal Data.

More specifically, the driving module 151 includes a driving switch transistor T1 and a first capacitor C1. A first control terminal of the driving switch transistor T1 is electrically connected to the first node N1, a second control terminal of the driving switch transistor T1 is electrically connected to the fourth node N4, and a first conductive terminal of the driving switch transistor T1 is electrically connected to the second node N2, and a second conductive terminal of the driving switch transistor T1 is electrically connected to the third node N3 and further electrically connected to the light-emitting module 155 through the third node N3. That is, the driving switch transistor T1 is a double-gate transistor having the first control terminal and the second control terminal.

The first capacitor C1 is electrically connected between the first node N1 and the third node N3, that is, electrically connected between the first control terminal and the second conductive terminal of the driving switch transistor T1. The driving switch transistor T1 is configured to be turned on or off under the control of the first control terminal and/or the second control terminal. The driving switch transistor T1 is configured to receive a turn-on voltage from the fourth node N4 through the adjustment module 153 and generate a corresponding current when being turned on, or receive a driving current from the control module 152 and drive the light-emitting module 155 to emit light according to the driving current.

The control module 152 includes a second switch transistor T2. A control terminal of the control module 152 is electrically connected to the light-emitting signal line EMi. A first conductive terminal of the second switch transistor T2 is electrically connected to the first power supply terminal VDD. A second conductive terminal of the second switch transistor T2 is electrically connected to the second node N2 and is further electrically connected to the adjustment module 153 and the first conductive terminal of the driving switch transistor T1 through the second node N2. The second switch transistor T2 is turned on when receiving the light-emitting signal provided by the light-emitting signal line Emi, so as to control the first power supply voltage provided by the first power supply terminal VDD to be transmitted to the second node N2. It can be understood that, when the second node N2 is connected to both the driving module 151 and the adjustment module 153, the first power supply voltage provided by the first power supply terminal VDD may be transmitted to the fourth node N4 through the adjustment module 153 when the adjustment module 153 is turned on, and a power supply voltage may be provided and transmitted to the first conductive terminal of the driving transistor T1 in the driving module 151 in cooperation with the data signal when the driving module 151 is turned on.

The adjustment module 153 includes a third switch transistor T3. A control terminal of the third switch transistor T3 is electrically connected to the adjustment control line Com i. A first conductive terminal of the third switch transistor T3 is electrically connected to the fourth node N4. A second conductive terminal of the third switch transistor T3 is electrically connected to the second node N2, and is further electrically connected to the first conductive terminal of the driving switch transistor T1 through the second node N2. The third switch transistor T3 is configured to be turned on under the control of the adjustment control signal KS output from the adjustment control line Com i, so that the fourth node N4 is electrically connected to the first conductive terminal of the driving switch transistor T1. Since the fourth node N4 is further electrically connected to the second control terminal of the driving switch transistor T1, therefore when the potential of the fourth node N4 is the first power supply voltage provided by the first power supply terminal VDD, the driving switch transistor T1 is turned on, so that the fourth node N4, the third switch transistor T3, the second node N2, the driving switch transistor T1, and the third node N3 form a conductive path, and then the fourth node N4 may sequentially discharge the driving switch transistor T1 and the third node N3 through the second node N2.

The storage module 154 includes a second capacitor C2, where a first terminal of the second capacitor C2 is electrically connected to the fourth node N4, and a second terminal of the second capacitor C2 is electrically connected to the third node N3. The second capacitor C2 is configure to store charges when the first power supply terminal VDD charges the fourth node N4 and maintain the potential of the fourth node N4 at the first power supply voltage.

The light-emitting module 155 includes a light-emitting element E. The light-emitting element E may be an organic light-emitting diode (OLED). An anode (AND) of the light-emitting element E is electrically connected to the third node N3. A cathode (CAT) of the light-emitting element E is electrically connected to the second power supply terminal ELVSS. The light-emitting module 155 is configured to emit light according to a driving current Ids provided by the driving switch transistor DT so as to perform image display.

The data loading module 156 is connected to the scan line Si, the data line Dj, and the driving module 151, and is configured to load the data signal Data into the first node N1 and the driving module 151 according to the scan signal in the data loading period H3.

In this embodiment, the data loading module 156 includes a fourth switch transistor T4 and a fifth switch transistor T5. The fourth switch transistor T4 serves as a data loading switch transistor, and is configured to receive the data signal Data from the data line Dj under the control of the scan signal, and transmit the data signal Data to the first node N1. The fifth switch transistor T5, as an auxiliary data loading switch transistor, is configured to transmit the low voltage provided by the second power supply terminal ELVDD to the third node N3 under the control of the scan signal.

Specifically, the fourth switch transistor T4 includes a first data loading control terminal T40, a first data loading conductive terminal T41, and a second data loading conductive terminal T42. The first data loading control terminal of the fourth switch transistor T4 is electrically connected to the scan line Si, the first data loading conductive terminal T41 of the fourth switch transistor T4 is electrically connected to the data line Dj, and the second data loading conductive terminal T42 of the fourth switch transistor T4 is electrically connected to the first node N1. The fourth switch transistor T4 is configured to receive the data signal Data from the data line Dj under the control of the scan signal and transmit the data signal Data to the first node N1.

The fifth switch transistor T5 includes a second data loading control terminal T50, a third data loading conductive terminal T53, and a fourth data loading conductive terminal T54. The second data loading control terminal T50 of the fifth switch transistor T5 is electrically connected to the scan line Si, the third data loading conductive terminal T53 of the fifth switch transistor T5 is electrically connected to the second power supply terminal ELVSS, and the fourth data loading conductive terminal T54 of the fifth switch transistor T5 is electrically connected to the third node N3. The fifth switch transistor T5 is configured to be turned on under the control of the scan signal output by the scan line Si, so as to control the second power supply terminal ELVSS to output the second power supply voltage to the third node N3. The voltage difference between the first node N1 and the third node N3 is a difference between the data voltage Vdata and the second power supply voltage (Vdata−$V_{GND}$). That is, a gate-source voltage $V_{TG\text{-}S}$ between the gate G and the source S of the driving switch transistor T1 is Vdata−$V_{GND}$, where $V_{GND}$ is the ground voltage of the ground terminal GND received by the second power supply terminal ELVSS. In the present embodiment, the ground voltage is 0V, and then the voltage of the first node N1 can be accurately maintained at the potential of the data voltage Vdata.

The initialization reset module 157 is connected to the adjustment control line Com i, the second power supply terminal ELVSS, the first node N1, and the third node N3. The initialization reset module 157 is configured to provide the second power supply voltage supplied by the second power supply terminal ELVSS to the first node N1 and the third node N3 under the control of the initialization control signal supplied by the adjustment control line Com i in the initialization reset period H1, so as to initialize the first node N1 and the third node N3.

In this embodiment, the initialization reset module 157 includes a sixth switch transistor T6 and a seventh switch transistor T7. In this embodiment, the sixth switch transistor T6 serves as a first reset switch transistor and is configured to provide an initialization reset voltage for the first node N1, and the seventh switch transistor T7 serves as a second reset switch transistor and is configured to provide an initialization reset voltage for the third node N3.

Specifically, the sixth switch transistor T6 includes a first initialization control terminal T60, a first initialization conductive terminal T61, and a second initialization conductive terminal T62. The first initialization control terminal T60 is electrically connected to the adjustment control line Com i, the first initialization conductive terminal T61 is electrically connected to the second power supply terminal ELVSS, and the second initialization conductive terminal T62 is electrically connected to the first node N1. The sixth switch transistor T6 is configured to be turned on or off under the control of the initialization control signal provided by the adjustment control line Com i, and supply the second power supply voltage provided by the second power supply terminal ELVSS to the first node N1 when the sixth switch transistor T6 is turned on.

Specifically, the sixth switch transistor T6 is configured to be turned on under the control of an initialization control signal revived by first initialization control terminal T60 and provided by the adjustment control line Com i. The first initialization conductive terminal T61 is electrically connected to the second initialization conductive terminal T62, so that the second power supply terminal ELVSS is electrically connected to the first node N1, the second power supply voltage provided by the second power supply terminal ELVSS is applied to the first node N1 through the sixth switch transistor T6, so as to initialize the first node N1.

It can be understood that the sixth switch transistor T6 is turned off when the first initialization control terminal T60 does not receiving any initialization control signal provided by the adjustment control line Com i. The first initialization conductive terminal T61 is electrically disconnected from the second initialization conductive terminal T62, and the first node N1 stops receiving the second power supply voltage from the second power supply terminal ELVSS.

Correspondingly, the seventh switch transistor T7 includes a second initialization control terminal T70, a third initialization conductive terminal T73, and a fourth initialization conductive terminal T74. The second initialization control terminal T70 is electrically connected to the adjustment control line Com i, the third initialization conductive terminal T73 is electrically connected to the second power supply terminal ELVSS, and the fourth initialization conductive terminal T74 is electrically connected to the third node N3. The seventh switch transistor T7 is configured to be turned on or off under the control of the initialization control signal provided by the adjustment control line Com i, and supply the second power supply voltage provided by the second power supply terminal ELVSS to the third node N3 when the seventh switch transistor T7 is turned on.

Specifically, the seventh switch transistor T7 is turned on under the control of the adjustment control signal KS received by the second initialization control terminal T70 and provided by the adjustment control line Com i. The third initialization conductive terminal T73 is electrically connected to the fourth initialization conductive terminal T74, so that the second power supply terminal ELVSS is electrically connected to the third node N3. In this way, the second power supply voltage provided by the second power supply terminal ELVSS is applied to the third node N3 through the seventh switch transistor T7, so as to initialize the third node N3.

It can be understood that, when the second initialization control terminal T70 of the seventh switch transistor T7 does not receive any initialization control signal provided by the adjustment control line Com i, the seventh switch transistor T7 is turned off, the third initialization conductive terminal T73 is electrically disconnected from the fourth initialization conductive terminal T74, and the third node N3 stops receiving the second power supply voltage from the second power supply terminal ELVSS.

In the present embodiment, the driving switch transistor T1 is an N-type double-gate thin film transistor, the first control terminal and the second control terminal thereof may be gates, the first conductive terminal may be a drain, and the second conductive terminal may be a source. In addition, the driving switch transistor T1 to the third switch transistor T3 are low-temperature poly-silicon (LTPS) thin film transistors. The fourth switch transistor T4 to the seventh switch transistor T7 are N-type oxide thin film transistors. In the present embodiment, the oxide thin film transistor may be, for example, an indium gallium zinc oxide (IGZO) thin film transistor.

It can be understood that, for each of the driving switch transistor T1 to the seventh switch transistor T7, the control terminal can be the gate of the thin film transistor, and the conductive terminals can be the source and the drain of the thin film transistor respectively. Of course, the above case can also be adjusted correspondingly according to specific requirements, which is not limited in the present disclosure.

In this embodiment, the driving switch transistor T1 to the seventh switch transistor T7 are N-type thin film transistors, and therefore, the driving switch transistor T1 to the seventh switch transistor T7 are turned on under the control of a high-level signal, that is, the control signal at a high level is a signal for effectively triggering the driving switch transistor T1 to the seventh switch transistor T7 to be turned on. The driving switch transistor T1 to the seventh switch transistor T7 are turned off under the control of a low-level signal. In other embodiments of the present disclosure, the driving switch transistor T1 to the seventh switch transistor T7 may also be P-type thin film transistors, and therefore, the driving switch transistor T1 to the seventh switch transistor T7 are turned on under the control of a low-level signal, that is, the control signal at a low level is a signal for effectively triggering the driving switch transistor T1 to the seventh switch transistor T7 to be turned on. The driving switch transistor T1 to the seventh switch transistor T7 are turned off under the control of a high-level signal.

Figure 4:
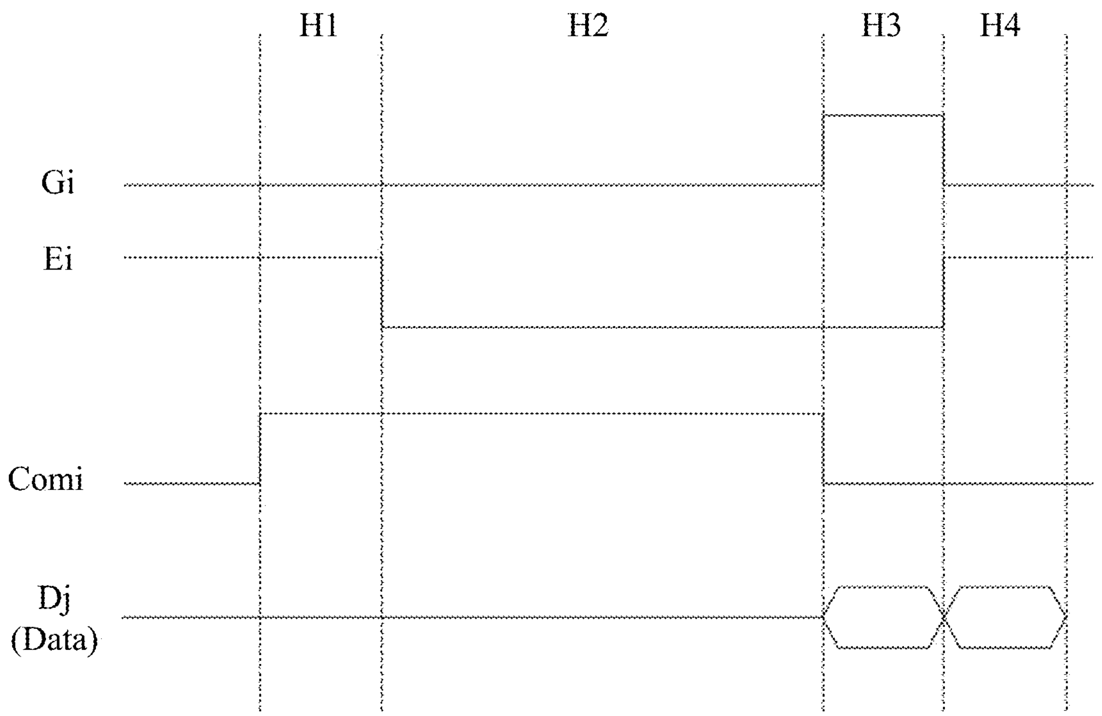
FIG. 4 is a timing chart of signal output of the pixel unit in FIG. 3.

Reference is made to FIGS. 3 and 4 together, where FIG. 4 is a timing chart of signal output in FIG. 3. Correspondingly, in an initialization reset period H1, a compensation period H2, a data loading period H3, and a light-emitting period H4 within one scanning cycle, the operating states of the pixel unit 15 are as follows.

In the initialization reset period H1, the light emitting signal terminal EM outputs a light-emitting signal, and at the same time, the adjustment control line Com also outputs an adjustment control signal KS. Both the light-emitting signal and the adjustment control signal KS are high-level pulse signals.

The light-emitting signal controls the second switch transistor T2 to be turned on, and at the same time, the adjustment control signal KS controls the third switch transistor T3, the sixth switch transistor T6, and the seventh switch transistor T7 to be turned on. The first power supply terminal VDD provides the first power supply voltage to the second node N2 and the fourth node N4 through the second switch transistor T2 and the third switch transistor T3. The second power supply terminal ELVSS outputs the second power supply voltage to the first node N1 and the third node N3 through the sixth switch transistor T6 and the seventh switch transistor T7. It can be understood that the second power supply voltage serves as a reset voltage for the first node N1 and the third node N3, or, the reset voltage for the first node N1 and the third node N3 is the second power supply voltage provided by the corresponding second power supply terminal ELVSS. In this embodiment, the second power supply voltage is a low voltage provided by the ground terminal GND.

In the compensation period H2, the light emitting signal terminal EM stops outputting the light-emitting signal, and the adjustment control line Com continues outputting the adjustment control signal KS. The second switch transistor T2 is turned off because the second switch transistor T2 does not receive any first initialization control signal, and the driving switch transistor T1 is turned on under the control of the fourth node N4. The fourth node N4, the third switch transistor T3, the second node N2, and the driving switch transistor T1 form a discharge path, and the fourth node N4 discharges to the driving switch transistor T1 and the third node N3 through the third switch transistor T3 and the second node N2. The fourth node N4 is gradually decreased from the first potential to the second potential until the driving switch transistor T1 is turned off.

Figure 5:
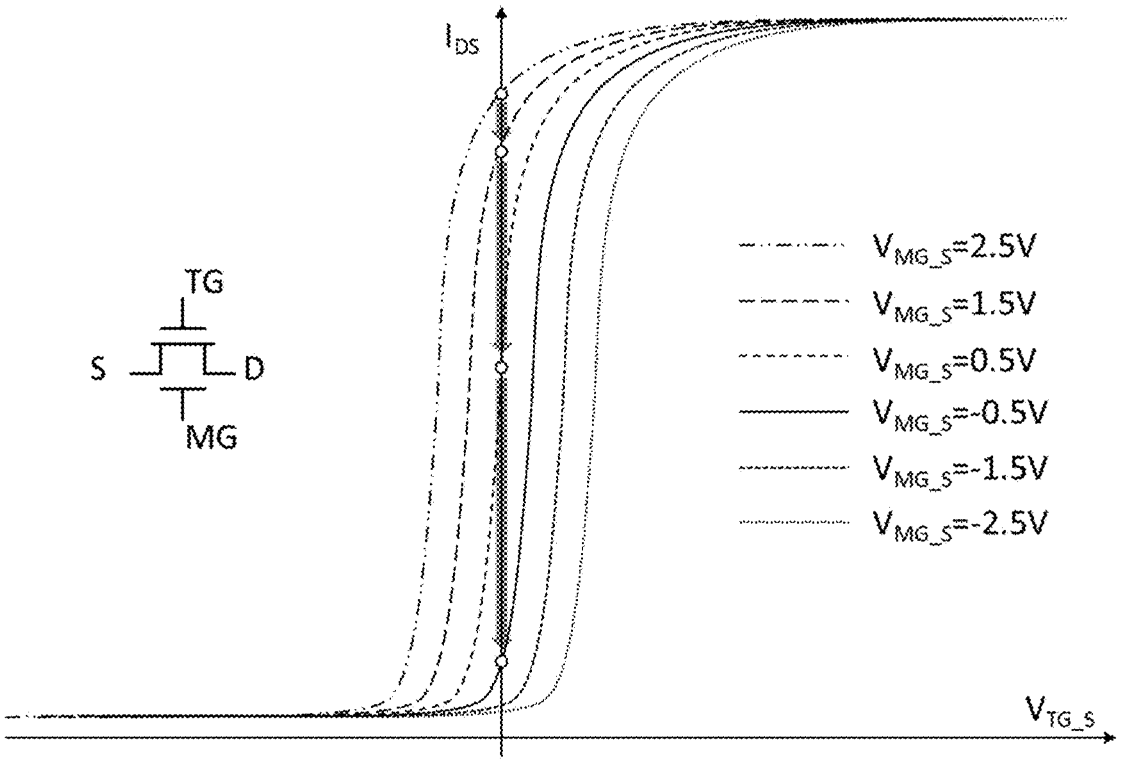
FIG. 5 is a schematic diagram illustrating a change of a conduction curve of a driving switch transistor in FIG. 3.

Reference is made to FIG. 5, which is a schematic diagram illustrating a change of a conduction curve of the driving switch transistor in FIG. 3. $V_{TG\_S}$ is a voltage difference between the first control terminal and the second conductive terminal of the driving switch transistor T1, that is, a voltage difference between the first gate and the source, that is, a voltage difference between the first node N1 and the third node N3. $V_{MG\_S}$ is a voltage difference between the second control terminal and the second conductive terminal of the driving switch transistor T1, that is, a voltage difference between the second gate and the source, that is, a voltage difference between the fourth node N4 and the third node N3. $I_{DS}$ is the magnitude of the current flowing through the driving switch transistor T1.

The discharge process is described in detail below according to a curve with $V_{MG\_S}$=2.5 V. At the start of the compensation period H2, for example, $V_{MG\_S}$=2.5 V ($V_{N4}-V_{N3}$=2.5 V) and $V_{TG\_S}$=0 V ($V_{N1}-V_{N4}$=0 V), and in this case, $I_{DS}>0$, and the driving switch transistor T1 is in an on state. As the compensation period H2 progresses, the fourth node N4 discharges to the driving switch transistor T1 through the third switch transistor T3 and the second node N2, so that the voltage difference ($V_{MG\_S}$) between the fourth node N4 and the third node N3 first decreases and then increases. That is to say, reference of the whole discharging process may be made to the arrow symbols on the vertical axis. $V_{TG\_S}$ is unchanged, and meanwhile the voltage of the fourth node N4 decreases. After the voltage of the fourth node N4 decreases to be less than the voltage of the third node N3, the voltage difference between the third node N3 and the fourth node N4 increases again, that is, $V_{MG\_S}$ is gradually increased, and the driving current $I_{DS}$ gradually decreases in this process. When the voltage of the fourth node N4 decreases to the preset voltage, the driving current $I_{DS}$ is negligible, and at this time, it may be considered that the driving switch transistor T1 is turned off. The critical voltage for the switch between turning-on and turning-off of the driving switch transistor T1 is the threshold voltage Vth. In this embodiment, $Vth=V_{TG\_S}=0$. In other embodiments, the value of the $V_{TG\_S}$ can be set to be other values in the initialization reset period H1. Since the value of the $V_{TG\_S}$ is maintained unchanged in the compensation period H2, correspondingly, the threshold voltage Vth can also be other values. That is, the threshold voltage Vth may be set according to specific requirements, which is not limited in the present disclosure.

In the data loading period H3, the scan line Si outputs a scan signal, the third switch transistor T3, the sixth switch transistor T6, and the seventh switch transistor T7 are turned off, and the second capacitor C2 is configured to maintain the voltage of the fourth node N4. Meanwhile, the scan signal controls the fourth switch transistor T4 and the fifth switch transistor T5 to be turned on, and the data line Dj outputs a data voltage $V_{data}$ (data signal) corresponding to the data signal Data to the first node N1 via the fourth switch transistor T4. Meanwhile, the second power supply terminal ELVSS outputs the second power supply voltage $V_{GND}$ to the third node N3 through the fifth switch transistor T5. At this time, $V_{TG\_S}=V_{N1}-V_{N4}=V_{data}-V_{GND}$. Since VGND is 0 V, the voltage difference between the first control terminal and the second conductive terminal of the driving switch transistor T1 is equal to the data voltage $V_{data}$ corresponding to the data signal.

When the data signal Data is input, the voltage of the third node N3 supplied by the second power supply voltage $V_{GND}$ is controlled, that is, the voltage of the third node N3 is accurately maintained at the second power supply voltage, so as to effectively maintain the voltage difference $V_{TG\_S}$ between the first control terminal and the second conductive terminal of the driving switch transistor T1, thereby avoiding the problem of poor image display effect due to the inaccurate voltage difference $V_{TG\_S}$.

In the light-emitting period H4, the scan line Si stops transmitting any scan signal, and the light-emitting signal line Emi outputs the light-emitting signal again. The fourth switch transistor T4 is turned off due to non-receipt of the scan signal, the data voltage $V_{data}$ written by the data line Dj is transmitted to the first node N1 and stored in the first capacitor C1. In other words, the first capacitor C1 maintains the voltage of the first node N1, and the light-emitting signal provided by the light-emitting signal line Emi controls the second switch transistor T2 to be turned on. A path is formed between the first power supply terminal VDD and the second power supply terminal ELVSS, and the driving switch transistor T1 and the light-emitting element E performs voltage division. The voltage of the third node N3 rises to $V_E+V_{GND}$ to drive the light-emitting element E to emit light, where $V_E$ is a voltage for driving the light-emitting element E to emit light.

While the voltage of the third node N3 is rising, the voltage of the first node N1, due to the coupling of the first capacitor C1, rises to $V_{data}+V_E+V_{GND}$, and the voltage of the fourth node N4, due to the coupling of the second capacitor C2, rises to $V_{MG}+V_E+V_{GND}$, and at this time, the current passing through the light-emitting element $I=(k/2)(V_{TG\_S}-V_{th})^2=(k/2)[(1-\alpha)(V_{data}-V_{GND}-V_{th})]^2$. Since $V_{th}=V_{TG\_S}=0$, $I=(k/2)[(1-\alpha)(V_{data}-VSS)]^2$.

In the initialization reset period H1, the adjustment control line Com controls the sixth switch transistor T6 and the seventh switch transistor T7 to write the same second power supply voltage respectively into the first node N1 and the third node N3. In other words, the ground voltage $V_{GND}$ is written. The threshold voltage $V_{th}$ of the driving switch transistor T1 satisfies $V_{th}=V_{GND}-V_{GND}=0$, that is, the voltage applied to the gate and source of the driving switch transistor T1 in the initialization reset period H1 and the compensation period H2 is adjusted, the threshold voltage of the driving switch transistor T1 can be accurately limited to 0V, so that it is convenient to perform uniform luminance compensation on the threshold voltage of the driving switch transistor T1 in each pixel unit 15 in the display region, to ensure the uniformity of brightness compensation. In the present embodiment, the threshold voltage of the driving module 151 in the pixel unit 15 can be directly adjusted to be within a preset range by providing the adjustment module 153 and the storage module 154, and therefore, the threshold voltages of the driving modules 151 in the adjacent pixel units 15 may be adjusted to be in the same preset range. As a result, difference in luminous intensities of adjacent pixel units caused by different threshold voltages of the driving modules 151 can be eliminated, and the brightness difference between adjacent pixel units 15 is avoided, so that the display effect is effectively improved.

Figure 6:
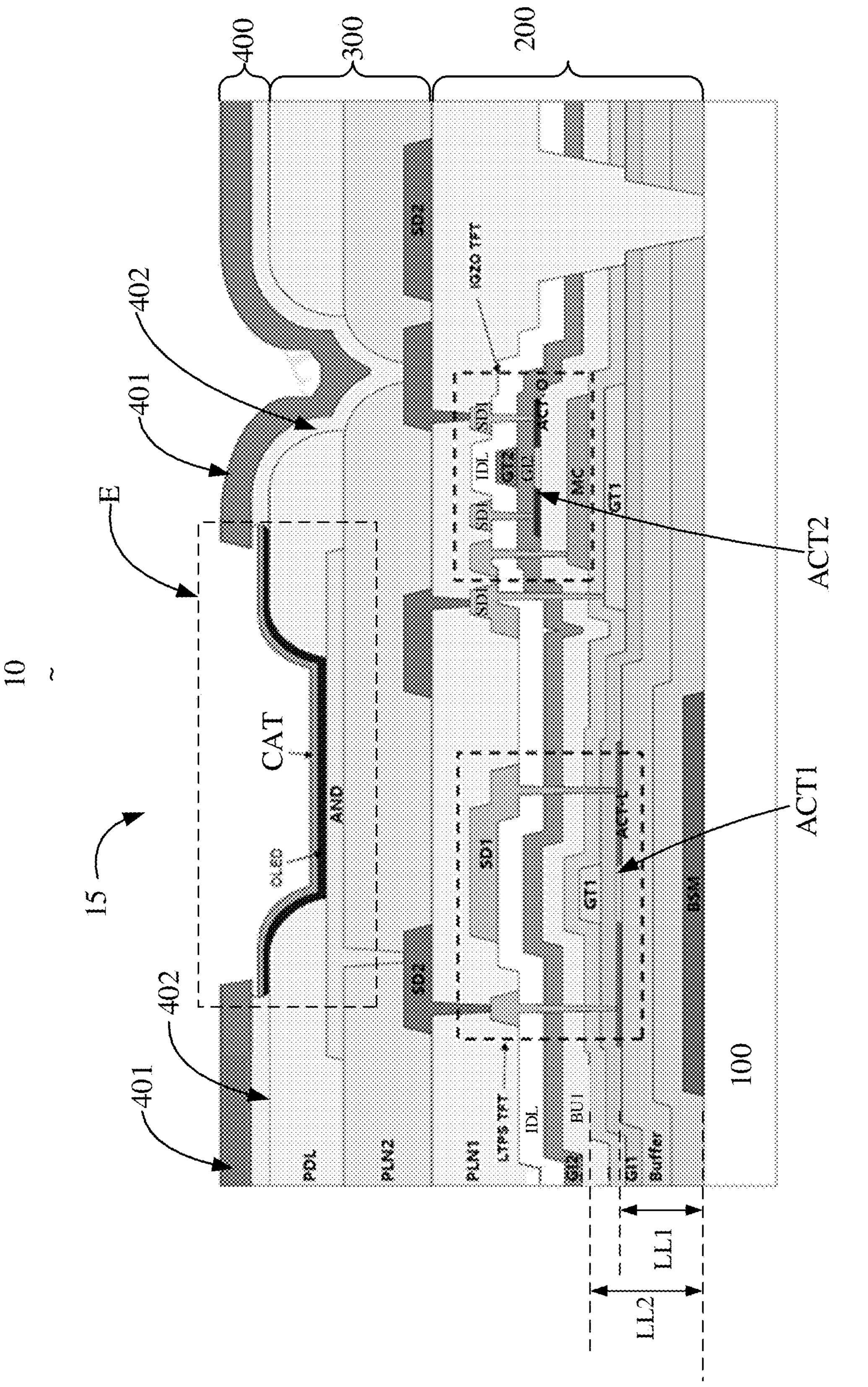
FIG. 6 is a schematic side view of partial elements in the display panel illustrated in FIG. 2 corresponding to a pixel unit.

Reference is made to FIG. 6, which is a schematic side view of partial elements in the display panel illustrated in FIG. 2 corresponding to a pixel unit.

As illustrated in FIG. 6, corresponding to the pixel units 15, the display panel 10 includes a substrate 100, a driving layer 200, a display layer 300, and a shielding structure 400.

The driving layer 200 is disposed on the substrate 100, the driving layer 200 is provided with components configured to drive the light-emitting element E in the display layer 300 to perform light-emitting. The first switch transistor T1 to the seventh switch transistor T7, the first capacitor C1, the second capacitor C2, etc. as illustrated in FIG. 5 are disposed in the driving layer 200, and the light-emitting element E as illustrated in FIG. 5 is disposed in the display layer 300. The shielding structure 400 is disposed on the periphery of the light-emitting element E, and is configured to separate pixel units 15 of different colors, thereby avoiding the problem of crosstalk of pixels.

More specifically, the driving layer 200 includes the first switch transistor T1, the third switch transistor T3, the fourth switch transistor T4, and the seventh switch transistor T7. The first switch transistor T1 to the third switch transistor T3 are low-temperature poly-silicon thin film transistors (LTPS TFTs), and the fourth switch transistor T4 to the seventh switch transistor T7 are oxide thin film transistors, such as an IGZO thin film transistor (IGZO TFT). FIG. 6 only illustrates one LTPS thin film transistor among the first switch transistor T1 to the third switch transistor T3 and one IGZO thin film transistor among the fourth switch transistor T4 to the seventh switch transistor T7.

For the LTPS thin film transistor, starting from the substrate 100, the LTPS thin film transistor includes a first active layer ACT1, a first gate insulation layer GI1, a first gate GT1, a first buffer layer BU1, a second gate insulation layer GI2, an interlayer insulation layer ILD, a first source-drain layer SD1 and a first planarization layer PLN1. In the present embodiment, the LTPS thin film transistor as illustrated in FIG. 6 is the driving switch transistor T1, which is a dual-gate transistor, and the material of the first active layer ACT1 is low-temperature poly-silicon. The first active layer ACT1 can be obtained by depositing amorphous silicon (a-Si) first and by converting the amorphous silicon (a-Si) into poly-silicon (P-Si) and then patterning. It can be understood that, one or more layer structures such as buffer layers Buffer may also be disposed between the first active layer ACT1 and the surface of the substrate 100.

For the IGZO thin film transistor, a second active layer ACT2, a second gate insulation layer GI2, a second gate GT2, an interlayer insulation layer ILD, a first source-drain layer SD1, and a first planarization layer PLN1 are sequentially disposed on the surface of the first buffer layer BU1. The IGZO thin film transistor is not directly disposed on the surface of the substrate 100, but is spaced apart from the surface of the substrate 100 by a preset distance.

In this embodiment, the IGZO thin film transistor illustrated in FIG. 6 is any one of the fourth switch transistor T4 to the seventh switch transistor T7, and the material of the second active layer ACT2 is indium gallium zinc oxide or the like. In this embodiment, the IGZO thin film transistor illustrated in FIG. 6 may be the sixth switch transistor T6 or the seventh switch transistor T7.

In the present embodiment, the distance between the IGZO thin film transistor and the substrate 100 is greater than that between the LTPS thin film transistor and the substrate 100. In other words, a first distance LL1 between the LTPS thin film transistor and the substrate 100 is less than a second distance LL2 between the IGZO thin film transistor and the substrate 100. More specifically, the first distance LL1 between the first active layer ACT1 in the LTPS thin film transistor and the substrate 100 is less than the second distance LL2 between the second active layer ACT2 in the IGZO thin film transistor and the substrate 100.

Since the fourth switch transistor T4 to the seventh switch transistor T7 are oxide IGZO thin film transistors, the fourth switch transistor T4 to the seventh switch transistor T7 have a small leakage current and are easy to realize low-frequency driving. In addition, since the leakage current is small, it is more beneficial to maintain the voltages of the first node N1 and the third node N3, so that no luminance attenuation occurs in low-frequency driving. The first switch transistor T1 to the third switch transistor T3 are LTPS thin film transistors, and therefore have a relatively high mobility, thereby effectively improving a driving current, ensuring that the display element E can generate a relatively high brightness, and at the same time, reducing a voltage drop of the first power supply terminal VDD due to the resistance of the LTPS thin film transistor when the first power supply terminal VDD supplies power, so that a voltage thereof reaches a preset potential faster. Reference is made to FIG. 6 again, the display layer 300 includes a second source-drain layer SD2 and a second planarization layer PLN2. The second source-drain layer SD2 is disposed on a surface of the first planarization layer PLNA1, and the second planarization layer PLN2 is disposed on a surface of the second source-drain layer SD2.

In the embodiment, a part of the second source-drain layer SD2 directly facing the LTPS thin film transistor is connected to and electrically conducted with the first source-drain layer SD1 in the LTPS thin film transistor. A part of the second source-drain layer SD2 directly facing the IGZO thin film transistor is connected to and electrically conducted with the first source-drain layer SD1 in the IGZO thin film transistor.

The display layer 300 further includes an anode AND, an organic material layer OLED, and a cathode CAT sequentially stacked on a surface of the second planarization layer PLNA2. The anode AND, the organic material layer OLED, and the cathode CAT constitute the light-emitting element E. The anode AND is electrically connected to the second source-drain layer SD2 of the LTPS thin film transistor as the driving switch transistor T1 through the opening of the second planarization layer PLN2.

In the present embodiment, a pixel definition layer PDL is further provided on the surface of the second planarization layer PLN2 and the anode AND. The pixel definition layer PDL further includes an opening (not shown) at a position corresponding to the anode AND. The anode AND is exposed from the position of the opening of the pixel definition layer PDL. In other words, part of the organic material layer OLED and the cathode CAT are sequentially laminated on the surface of the anode AND corresponding to the position of the opening of the pixel definition layer PDL. In other words, the part of the organic material layer OLED and the cathode CAT which are stacked are disposed in the same layer as the pixel definition layer PDL, the other part of the stacked organic material layer OLED and the cathode CAT is disposed on the surface of the pixel definition layer PDL at a position other than the opening. In the present embodiment, the pixel definition layer PDL is arranged to surround the organic material layer OLED for shielding light emitted by two adjacent light-emitting elements E from light mixing interference.

The shielding structure 400 (overhanging) includes an overhanging conductive structure 401 and a blocking structure 402 which are disposed on the periphery of the light-emitting element E. The overhanging conductive structure 401 is disposed on the surface of the pixel definition layer, and the blocking structure 402 covers and shields the overhanging conductive structure 401, i.e. the orthographic projection area of the blocking structure 402 on the substrate 100 is greater than that of the overhanging conductive structure 401 on the substrate 100. In this embodiment, the overhanging conductive structure 401 is connected to the power supply module 20 to serve as the second power supply terminal ELVSS to receive the second power supply voltage. Since the second power supply terminal ELVSS is connected to the ground terminal GND in this embodiment, the overhanging conductive structure 401 as a whole can serve as a ground wiring or a ground signal line.

In this embodiment, the material of the overhanging conductive structure 401 may be one or two of conductive metals such as Mo, Al, Mg, Cu and Cr, or conductive oxides such as ITO and IZO. The blocking structure 402 may be made of an insulating material or a non-insulating material, and is used for protecting the overhanging conductive structure 401, and cooperating with the overhanging conductive structure 401 to prevent light emitted by the light-emitting element E from being mixed with light emitted by other adjacent pixel units 15. The blocking structure 402 may be made of an inorganic insulating material such as SiNx, SiOx or the like, or an inorganic conductive material such as Ti or the like.

In the present embodiment, the shielding structure 400 is formed by mask-free evaporation in cooperation with a process of lithography OLED, i.e., an environment positive, Lithography with mask-less deposition, Extreme long life, low power, and high luminance, Any shape Patterning (eLEAP) OLED manufacturing process technology. By forming the blocking structures 402 on the surface of the overhanging conductive structure 401, the blocking effect of the overhanging conductive structure 401 can be enhanced. As a result, when depositing the organic material layer OLED and the cathode CAT of the light-emitting element E in the pixel unit 15 by evaporation, the overhanging conductive structure 401 and the blocking structure 402 can better prevent the organic light-emitting material and the cathode material from depositing in light-emitting regions where light-emitting elements E in other color pixel units 15 are located, which can avoid the light crosstalk of the pixel units more effectively.

In the present embodiment, the overhanging conductive structure 401 can directly extend along a direction close to the substrate 100 through an opening (not illustrated) of the pixel definition layer PDL as illustrated in FIG. 6, and is electrically connected with the second source-drain layer SD2 correspondingly connected to the IGZO thin film transistor. Alternatively, in other embodiments of the present disclosure, the overhanging conductive structure 401 may also be directly disposed on a surface of the pixel definition layer PDL, and then electrically connected to the second source-drain layer SD2 correspondingly connected to the IGZO thin film transistor through other conductive structures. It can be understood that, in this embodiment, the overhanging conductive structure 401 only needs to be electrically connected to the second source-drain layer SD2 of the IGZO thin film transistor, and the connection manner can be correspondingly adjusted according to the specific structure of the shielding structure 400, which is not limited to the foregoing structure and connection manner.

The overhanging conductive structure 401 is electrically connected to the second source-drain layer SD2 of the IGZO thin film transistor serving as the sixth switch transistor T6 or the seventh switch transistor T7, and at the same time, the overhanging conductive structure 401 is also electrically connected to the cathode CAT at the same time. Thus, the cathode CAT of the light-emitting element E can be directly connected to the conductive terminal of the sixth switch transistor T6 or the seventh switch transistor T7 through the overhanging conductive structure 401, and the overhanging conductive structure 401, directly serving as the second power supply terminal ELVSS, can receive the second power supply voltage, so as to provide the second power supply voltage directly to the cathode CAT of the light-emitting element E, and to the conductive terminals of the sixth switch transistor T6 and the seventh switch transistor T7.

In this embodiment, since the IGZO thin film transistor is disposed on the surface of the first buffer layer BU1, the IGZO thin film transistor is closer to the overhanging conductive structure 401 than the LTPS thin film transistor, and thus it is more convenient for the IGZO thin film transistor to be electrically connected to the second power supply terminal ELVSS in terms of manufacturing process. At the same time, the IGZO thin film transistor and the LTPS thin film transistor are staggered in the thickness direction of the display panel 10, so that it is more beneficial to reduce the space occupied by the thin film transistor in the plane where the display panel 10 is located, and it is more beneficial to reduce the area occupied by the pixel unit 15, thereby providing a larger space for the display panel 10 to improve the pixel resolution. In this embodiment, the overhanging conductive structure 401 is connected to the ground terminal GND of the external power supply module 20 and the second power supply terminal ELVSS. The overhanging conductive structure 401 transmits the ground voltage $V_{GND}$ received from external as the second power supply voltage to the second power supply terminal ELVSS, so as to provide the second power supply voltage at a low voltage level is provided for the pixel unit 15, so that there is no need to separately adjust the control line Com, and the structure of the pixel unit 15 and the display panel 10 is further simplified.

Figure 7:
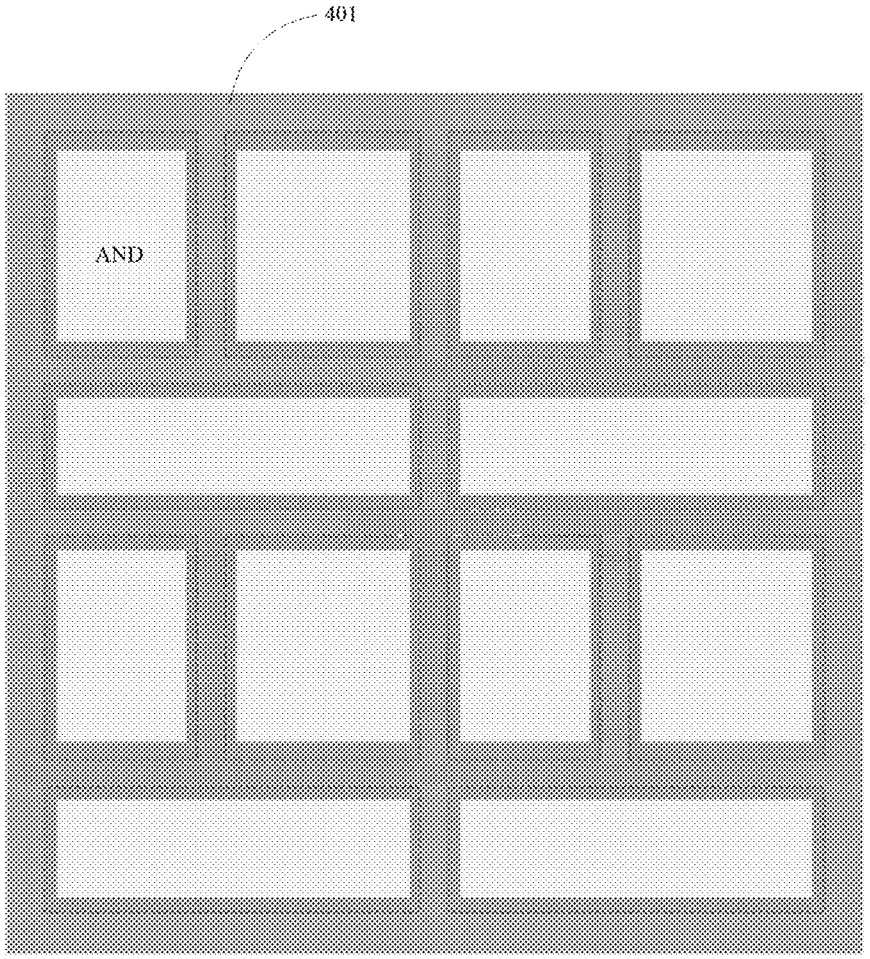
FIG. 7 is a top view of a display layer and a shielding structure in part of pixel units in a display region of a display panel.

Reference is made to FIG. 7, which is a top view of the display layer 300 and the shielding structure 400 in part of the pixel units 15 in the display region **10*a* of the display panel 10. As illustrated in FIG. 7, the overhanging conductive structure 401 is disposed to surround the light-emitting element E and is electrically connected to the cathode CAT of the light-emitting element E. Thus, the shielding structure 400 and the overhanging conductive structure 401 form a mesh structure as a whole. In this embodiment, the overhanging conductive structure 401 forms a mesh structure as a whole, so that the overall resistance of the wiring connected to the second power supply terminal ELVSS and providing the ground voltage GND in the display panel 10 is relatively small, and each pixel unit 15 can be ensured to accurately obtain the low second power supply voltage, which is convenient for the pixel unit 15** to accurately obtain the compensation signal and the data signal so as to accurately execute image display.

Figure 8:
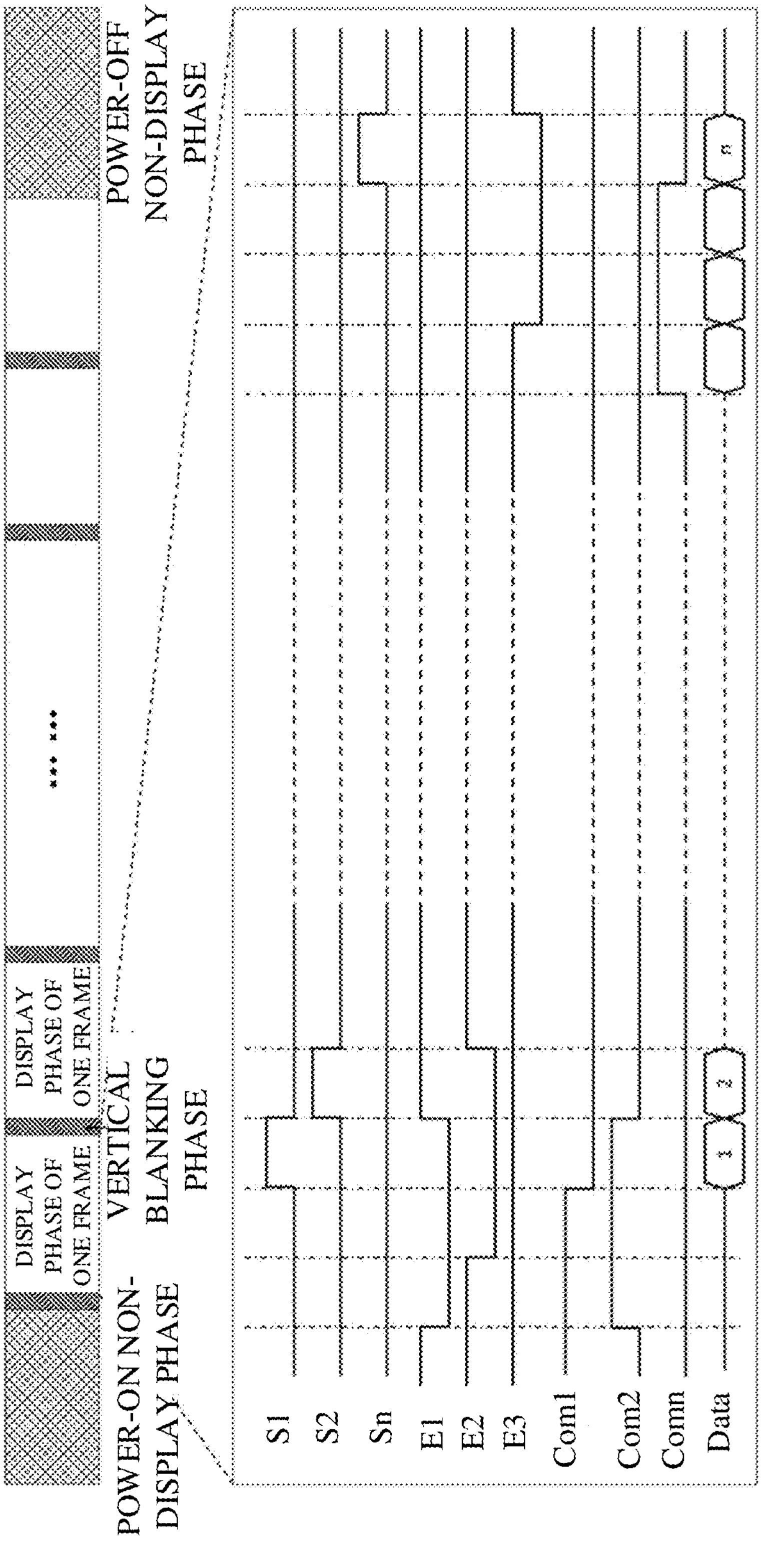
FIGS. 8-10 are timing charts of signal output of the display device in FIGS. 2-3 during a compensation process.
Figure 9:
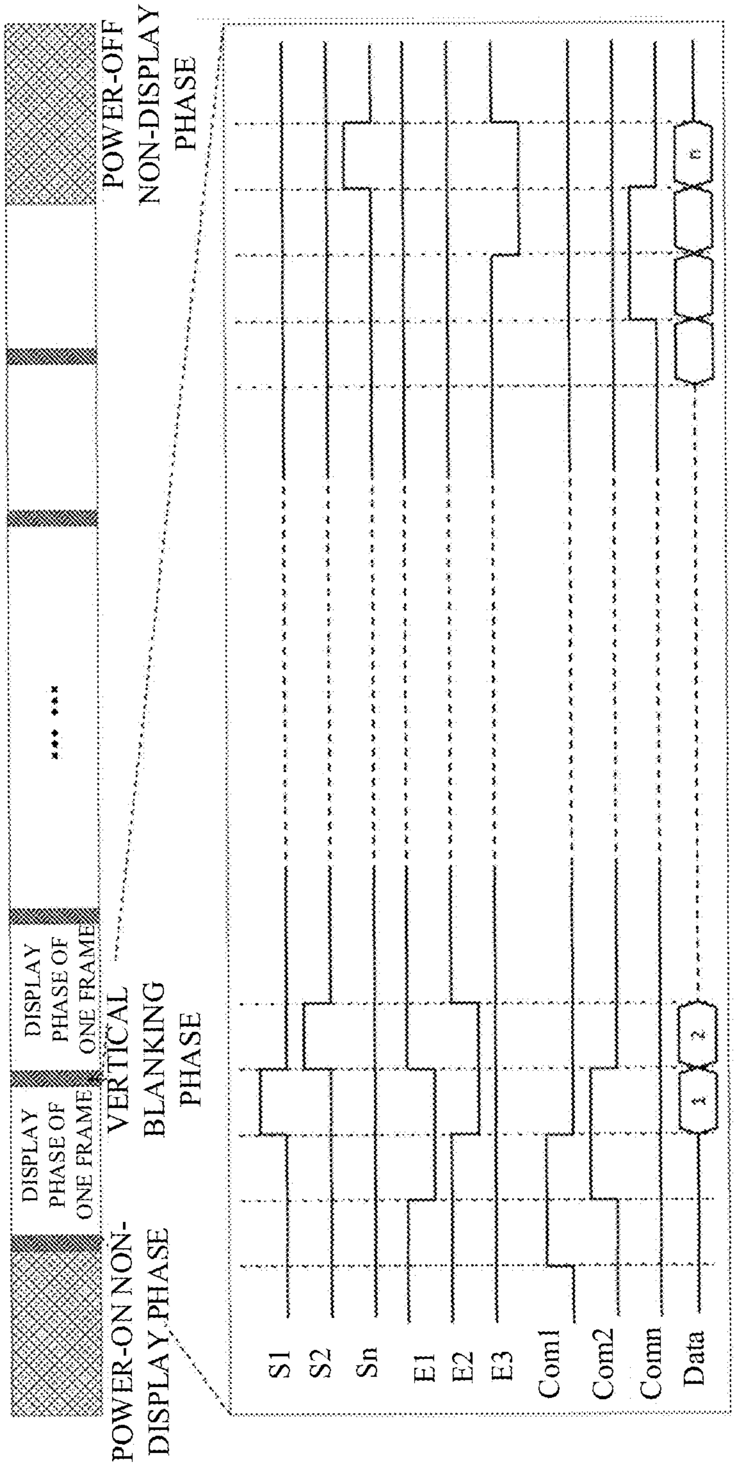
Figure 10:
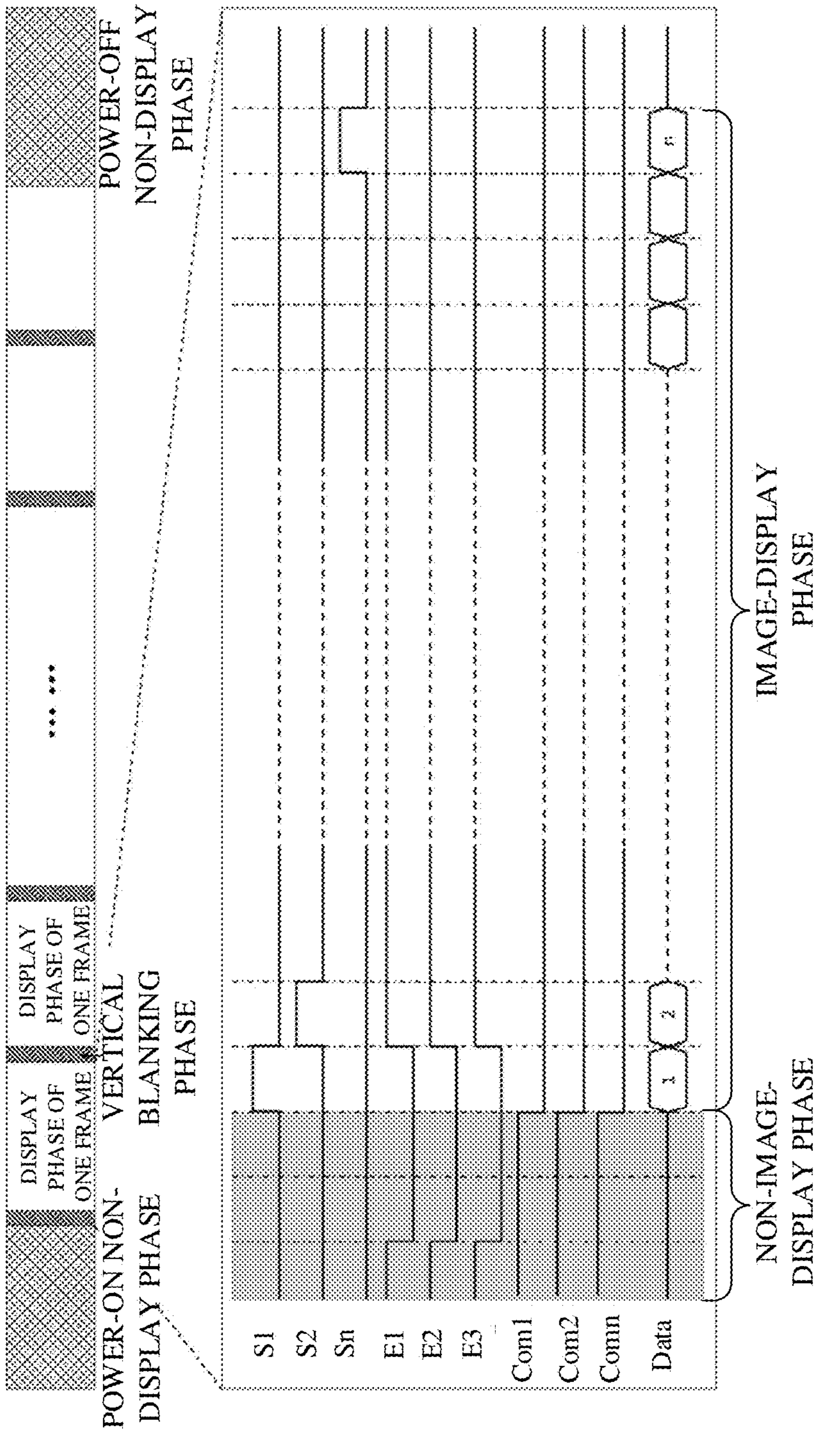

As illustrated in FIG. 8, the display device 1 has a first compensation mode and a second compensation mode. Reference is made to FIGS. 8 to 10, FIGS. 8 to 10 are timing charts of signal output of the display device in FIGS. 2-3 during a compensation process.

As illustrated in FIGS. 8 and 9, when the first compensation mode is performed, for each of the pixel units 15, in a display phase of each frame of image in the display process of each frame of image, the m scan lines sequentially output scan signals, and at the same time, the adjustment signal line Com and the emission control line EM output signals according to a preset timing for adjusting the threshold voltage Vth of the driving switch transistor T1 in the pixel unit 15. That is, the threshold voltage Vth is compensated in the compensation period H2, and then the data signal is received to display an image. That is, the pixel unit 15 performs the process of initialization reset period H1 to the light-emitting period H4 in sequence in the display process of each frame of image. In other words, in the display phase of each frame of image in this embodiment, the pixel unit 15 sequentially performs the initialization reset period H1, the compensation period H2, the data loading period H3, and the light-emitting period H4. In this embodiment, the compensation period H2 lasts for two units of time.

In an embodiment of the present disclosure, as illustrated in FIG. 8, in the initialization reset period H1 and the compensation period H2, both the first node N1 and the third node N3 of the driving switch transistor T1 are in the compensation state, which may last for two periods. As illustrated in FIG. 9, both the first node N1 and the third node N3 of the driving switch transistor T1 are in the compensation state in the compensation period H2. In this embodiment, the compensation period H2 lasts for one unit of time. It can be understood that, the longer the compensation time for the driving switch transistor T1 is, the better the compensation effect is.

As illustrated in FIG. 10, in a second compensation mode, for each pixel unit 15, in a non-image-display phase, the pixel unit 15 is configured to adjust the threshold voltage Vth of the driving switch transistor T1 in the initialization reset period H1 and the compensation period H2. In the image-display phase, the pixel unit 15 executes the data loading period H3 and the light-emitting period H4, and is configured to receive a data signal to execute image display. The non-image-display phase may be a power-on non-display phase of the display panel 10 or a vertical blanking phase between any two adjacent frames of images. That is, the initialization reset period H1 and the compensation period H2 correspond to the non-image-display phase, and the data loading period H3 and the light-emitting period H4 correspond to the image-display phase. In other words, the display phase of one frame of image only corresponds to the data loading period H3 and the light-emitting period H4.

Before the display phase of each frame of image, i.e. in the vertical blanking phase or the power-on non-display phase of the non-image-display phase, the pixel units 15 on the entire surface of the display panel 10 are compensated at the same time. While in the display phase of each frame of image, the pixel unit 15 only receives data signals to display images, or does not need to compensate for each frame. Instead, the compensation is performed once in the vertical blanking phase after the display phase of every continuous a frames of images. In other words, the initialization reset period H1 and the compensation period H2 are in the vertical blanking phase after the display phase of every a frames of images, where a is an integer greater than or equal to 1. In other words, the threshold voltage of the driving switch transistor can be adjusted after the display phase of continuous multiple frames of images. That is, the initialization reset period H1 and the compensation period H2 in the first compensation mode may be performed in the non-image-display phase, so that the process of setting the threshold voltage of the driving switch transistor T1 is completed. In this way, in the display phase of one frame of image, it is not necessary to execute the foregoing two periods, and only the data loading period H3 and the light-emitting period H4 are executed, so as to complete the data writing and light-emitting processes.

In this embodiment, the initialization reset period H1 and the compensation period H2 are both executed in the non-image-display phase, the data loading period H3 and the light-emitting period H4 are both executed in the image-display phase. The non-image-display phase is a power-on non-display phase or a vertical blanking phase between any two adjacent frames of images, so that the time for the pixel unit 15 to perform image display is effectively increased, and the image display effect is better.

The embodiments of the present disclosure also have the effect of increasing the threshold voltage compensation range. The specific principle is as follows. It can be seen from the foregoing current formula that $I=(k/2)(V_{TG\_S}-Vth)^2$. In the embodiment of the present disclosure, after the compensation period H2 and the data loading period H3, $V_{TG\_S}=V_{data}-0$, that is to say, $V_{TG\_S}$ does not contain Vth. However, with regard to the traditional solution with the driving switch transistor having a single gate, after the compensation period H2 and the data loading period H3, a gate-source voltage $V_{TG\_S}$ of the driving switch transistor T1 satisfies $V_{TG\_S}=V_{data}+Vth-Vt$, where Vt here can be understood as a reference voltage. In this case, $V_{TG\_S}$ (a gate-source voltage difference) here contains the threshold voltage Vth. Due to the existence of the threshold voltage Vth, the overall range of the data voltage $V_{data}$ corresponding to the data signal Data will be compressed, and therefore the compensation range for the threshold voltage Vth is limited.

However, in embodiments of the present disclosure, the gate-source voltage $V_{TG\_S}$ of the driving switch transistor T1 does not contain the threshold voltage Vth, and therefore, even if the range of the threshold voltage Vth is set to be very large, the entire range of the data voltage Vdata will not be compressed. In addition, since the pixel unit 15 can be compensated in the non-image-display phase according to the embodiments of the present disclosure, the occupation of the display phase is reduced, and the threshold voltage of the driving module 151 can be adjusted and compensated in the case of displaying at intervals of display of multiple frames of images. The driving switch transistor T1 does not need to be compensated in every frame, thereby effectively avoiding the problem that the compensation time of the driving switch transistor T1 is insufficient due to the compression and reduction of the compensation time in order to ensure the refresh rate of the image display. Thus, the compensation time is increased effectively, and the threshold voltage of the driving switch transistor T1 is compensated more fully, accuracy and uniformity of image display are ensured, and the image display effect is better.

In embodiments of the present disclosure, the initialization reset module 157 is configured to perform an initialization reset in the initialization reset period H1 and assist in performing threshold voltage compensation for the driving switch transistor T1 in the compensation period H2. The data loading module 156 is configured to perform loading of the data signal Data in the data loading period H3. The initialization reset period H1, the compensation period H2, and the data loading period H3 are performed by mutually independent modules in different periods, thus the data loading period H3 will not be occupied at all by the initialization reset period H1 or the compensation period H2. In other words, the occupancy of time for performing image display on the pixel units 15 is effectively reduced, and the image display effect is more effectively improved.

In the embodiments of the present disclosure, the initialization reset module 157 and the data loading module 156 adopt IGZO thin film transistors, and since the leakage current thereof is relatively small, it is easy to realize low-frequency driving, thereby ensuring image display at a low refresh rate. Meanwhile, since the leakage current of the IGZO thin film transistor is small, it is more beneficial to maintain the voltage and current load of the corresponding driving module 151 at the corresponding node when the pixel unit 15 performs compensation at the same time.

In the embodiment of the present disclosure, the overhanging conductive structure 40 is in a mesh structure as a whole, and the overhanging conductive structure 40 is connected to both the IGZO thin film transistor and the second power supply terminal ELVSS, so that the overall resistance of the wiring providing the ground voltage $V_{GND}$ in the display panel 10 is relatively small, and the overhanging conductive structure 40 in a mesh structure is multiplexed to effectively bear a large current load when the entire surface of the display panel 10 is compensated at the same time. In addition, each pixel unit 15 can be ensured to accurately obtain the low second power supply voltage, so that the pixel unit 15 can accurately obtain the compensation signal and the data signal to accurately display an image.

It should be understood that the application of the present disclosure is not limited to the above examples, and those skilled in the art can make improvements or modifications according to the above descriptions, and all these improvements and modifications shall belong to the scope of protection of the appended claims of the present disclosure.

What is claimed is:

1. A display panel, comprising a display region, the display panel comprising a plurality of pixel units arranged in an array, and the plurality of pixel units each being configured to execute image display according to a received data signal;

wherein each of the plurality of pixel units comprises a driving module, an adjustment module, an initialization reset module, and a light-emitting module, the driving module and the light-emitting module are sequentially connected in series between a first power supply terminal and a second power supply terminal, the adjustment module is electrically connected to the driving module, and the initialization reset module is electrically connected to the driving module and the second power supply terminal;

wherein the initialization reset module is configured to transmit a second power supply voltage provided by the second power supply terminal to the driving module according to an adjustment control signal in an initialization reset period and a compensation period, to cooperate to perform reset and data compensation on the driving module;

wherein the adjustment module is configured to adjust a threshold voltage of at least one driving switch transistor of the driving module to be within a preset range according to the adjustment control signal in cooperation with the second power supply voltage in the initialization reset period and the compensation period, the at least one driving switch transistor is configured to provide a driving current to the light-emitting module according to the data signal in a light-emitting period in cooperation with a first power supply voltage provided by the first power supply terminal and to drive the light-emitting module to emit corresponding light to execute image display; and wherein the initialization reset period, the compensation period, a data loading period, and the light-emitting period are sequentially arranged in time.

2. The display panel of claim 1, wherein each of the plurality of pixel units further comprises a control module and a storage module, the control module is electrically connected between the first power supply terminal and the driving module, the control module is also electrically connected between the first power supply terminal and the adjustment module, and the storage module is electrically connected to the adjustment module and the driving module;

in the initialization reset period, the control module is configured to control, according to a light-emitting signal, the first power supply terminal to provide the first power supply voltage for the storage module via the adjustment module; and in the compensation period, the adjustment module is configured to control the storage module to discharge to the driving module to adjust a threshold voltage of the driving module to be within the preset range.

3. The display panel of claim 2, wherein each of the plurality of pixel units further comprises a data loading module, the data loading module is electrically connected to a data line, a scan line, the driving module, and the second power supply terminal; the data loading module is configured to receive the data signal from the data line under the control of a scan signal provided by the scan line in the data loading period and transmit the data signal to the driving module, and simultaneously transmit the second power supply voltage provided by the second power supply terminal to the driving module; and the driving module is configured to provide the driving current for the light-emitting module under the control of the data signal in cooperation with the first power supply voltage and the second power supply voltage, wherein the first power supply voltage is greater than the second power supply voltage.

4. The display panel of claim 3, wherein the data loading module comprises a data loading switch transistor and an auxiliary data loading switch transistor, the data loading switch transistor is configured to transmit the data signal received from the data line to a first node of the driving module under the control of the scan signal, the auxiliary data loading switch transistor is configured to transmit the second power supply voltage to a third node of the driving module under the control of the scan signal, a voltage difference between the first node and the third node serves as the threshold voltage for controlling the driving module to be turned on or off, the auxiliary data loading switch transistor is connected to the second power supply terminal, the driving module is further connected to the control module via a second node, and the adjustment module is connected to the storage module via a fourth node, and a voltage difference between the fourth node and the third node is also used to control the driving module to be turned on or off.

5. The display panel of claim 4, wherein the initialization reset module comprises a first reset switch transistor and a second reset switch transistor, the first reset switch transistor is configured to transmit the second power supply voltage provided by the second power supply terminal to the first node under the control of the adjustment control signal, the second reset switch transistor is configured to transmit the second power supply voltage provided by the second power supply terminal to the third node under the control of the adjustment control signal, and the second reset switch transistor is connected to the second power supply terminal.

6. The display panel of claim 5, wherein the control module, the driving module, and the adjustment module comprise a plurality of low-temperature poly-silicon thin film transistors as switch transistors; and the initialization reset module and the data loading module comprise a plurality of oxide thin film transistors as switch transistors.

7. The display panel of claim 6, wherein for any pixel unit, the display panel comprises a substrate, a driving layer, a display layer, and a shielding structure stacked in sequence; the plurality of low-temperature poly-silicon thin film transistors and the plurality of oxide thin film transistors are located in the driving layer, the plurality of low-temperature poly-silicon thin film transistor are spaced apart from the substrate by a first distance, the plurality of oxide thin film transistors are spaced apart from the substrate by a second distance, and the first distance is less than the second distance; the display layer comprises at least one light-emitting element, and the shielding structure is disposed to surround the at least one light-emitting element in the display layer; the shielding structure is electrically connected to the at least one light-emitting element and at least one oxide thin film transistor, and the shielding structure is configured to receive the second power supply voltage and transmit the second power supply voltage to the at least one light-emitting element and the at least one oxide thin film transistor.

8. The display panel of claim 7, wherein the shielding structure comprises an overhanging conductive structure and a blocking structure which are stacked, the overhanging conductive structure is disposed on a surface of the display layer and electrically connected to the second power supply terminal, and is electrically connected to a conductive terminal of the at least one oxide thin film transistor through an opening of the display layer, and the overhanging conductive structure is configured to receive the second power supply voltage from external and transmit the second power supply voltage to the second power supply terminal and the at least one oxide thin film transistor.

9. A display device, comprising a power supply module and a display panel, wherein the power supply module is configured to supply driving power for the display panel to drive the display panel to execute image display;

wherein the display panel comprises a display region, the display panel comprises a plurality of pixel units arranged in an array, and the plurality of pixel units each is configured to execute image display according to a received data signal;

wherein each of the plurality of pixel units comprises a driving module, an adjustment module, an initialization reset module, and a light-emitting module, the driving module and the light-emitting module are sequentially connected in series between a first power supply terminal and a second power supply terminal, the adjustment module is electrically connected to the driving module, and the initialization reset module is electrically connected to the driving module and the second power supply terminal;

wherein the initialization reset module is configured to transmit a second power supply voltage provided by the second power supply terminal to the driving module according to an adjustment control signal in an initialization reset period and a compensation period, to cooperate to perform reset and data compensation on the driving module;

wherein the adjustment module is configured to adjust a threshold voltage of at least one driving switch transistor of the driving module to be within a preset range according to the adjustment control signal in cooperation with the second power supply voltage in the initialization reset period and the compensation period, the at least one driving switch transistor is configured to provide a driving current to the light-emitting module according to the data signal in a light-emitting period in cooperation with a first power supply voltage provided by the first power supply terminal and to drive the light-emitting module to emit corresponding light to execute image display; and wherein the initialization reset period, the compensation period, a data loading period, and the light-emitting period are sequentially arranged in time.

10. The display device of claim 9, wherein each of the plurality of pixel units further comprises a control module and a storage module, the control module is electrically connected between the first power supply terminal and the driving module, the control module is also electrically connected between the first power supply terminal and the adjustment module, and the storage module is electrically connected to the adjustment module and the driving module;

in the initialization reset period, the control module is configured to control, according to a light-emitting signal, the first power supply terminal to provide the first power supply voltage for the storage module via the adjustment module; and in the compensation period, the adjustment module is configured to control the storage module to discharge to the driving module to adjust a threshold voltage of the driving module to be within the preset range.

11. The display device of claim 10, wherein each of the plurality of pixel units further comprises a data loading module, the data loading module is electrically connected to a data line, a scan line, the driving module, and the second power supply terminal; the data loading module is configured to receive the data signal from the data line under the control of a scan signal provided by the scan line in the data loading period and transmit the data signal to the driving module, and simultaneously transmit the second power supply voltage provided by the second power supply terminal to the driving module; and the driving module is configured to provide the driving current for the light-emitting module under the control of the data signal in cooperation with the first power supply voltage and the second power supply voltage, wherein the first power supply voltage is greater than the second power supply voltage.

12. The display device of claim 11, wherein the data loading module comprises a data loading switch transistor and an auxiliary data loading switch transistor, the data loading switch transistor is configured to transmit the data signal received from the data line to a first node of the driving module under the control of the scan signal, the auxiliary data loading switch transistor is configured to transmit the second power supply voltage to a third node of the driving module under the control of the scan signal, a voltage difference between the first node and the third node serves as the threshold voltage for controlling the driving module to be turned on or off, the auxiliary data loading switch transistor is connected to the second power supply terminal, the driving module is further connected to the control module via a second node, and the adjustment module is connected to the storage module via a fourth node, and a voltage difference between the fourth node and the third node is also used to control the driving module to be turned on or off.

13. The display device of claim 12, wherein the initialization reset module comprises a first reset switch transistor and a second reset switch transistor, the first reset switch transistor is configured to transmit the second power supply voltage provided by the second power supply terminal to the first node under the control of the adjustment control signal, the second reset switch transistor is configured to transmit the second power supply voltage provided by the second power supply terminal to the third node under the control of the adjustment control signal, and the second reset switch transistor is connected to the second power supply terminal.

14. The display device of claim 13, wherein the control module, the driving module, and the adjustment module comprise a plurality of low-temperature poly-silicon thin film transistors as switch transistors; and the initialization reset module and the data loading module comprise a plurality of oxide thin film transistors as switch transistors.

15. The display device of claim 14, wherein for any pixel unit, the display panel comprises a substrate, a driving layer, a display layer, and a shielding structure stacked in sequence; the plurality of low-temperature poly-silicon thin film transistors and the plurality of oxide thin film transistors are located in the driving layer, the plurality of low-temperature poly-silicon thin film transistor are spaced apart from the substrate by a first distance, the plurality of oxide thin film transistors are spaced apart from the substrate by a second distance, and the first distance is less than the second distance; the display layer comprises at least one light-emitting element, and the shielding structure is disposed to surround the at least one light-emitting element in the display layer; the shielding structure is electrically connected to the at least one light-emitting element and at least one oxide thin film transistor, and the shielding structure is configured to receive the second power supply voltage and transmit the second power supply voltage to the at least one light-emitting element and the at least one oxide thin film transistor.

16. The display device of claim 15, wherein the shielding structure comprises an overhanging conductive structure and a blocking structure which are stacked, the overhanging conductive structure is disposed on a surface of the display layer and electrically connected to the second power supply terminal, and is electrically connected to a conductive terminal of the at least one oxide thin film transistor through an opening of the display layer, and the overhanging conductive structure is configured to receive the second power supply voltage from external and transmit the second power supply voltage to the second power supply terminal and the at least one oxide thin film transistor.

17. The display device of claim 9, wherein the display device has a first compensation mode and a second compensation mode;

wherein in the first compensation mode, for each of the plurality of pixel units, a display phase for each frame of image comprises the initialization reset period, the compensation period, the data loading period, and the light-emitting period which are sequentially arranged in time;

wherein in the second compensation mode, for each of the plurality of pixel units, the initialization reset period and the compensation period correspond to a non-image-display phase, and the data loading period and the light-emitting period correspond to an image-display phase, wherein the non-image-display phase is a power-on non-display phase; or, in the second compensation mode, for each of the plurality of pixel units, the initialization reset period and the compensation period are performed in a non-image-display phase, and the data loading period and the light-emitting period are performed in an image-display phase; and wherein the non-image-display phase is a vertical blanking phase, and the vertical blanking phase is located between image-display phases of two adjacent frames, or the initialization reset period and the compensation period are located in a vertical blanking phase of every a frames, wherein a is an integer greater than 1.

* * * * *